(12) United States Patent
Lhuillier et al.

(10) Patent No.: US 11,921,147 B2
(45) Date of Patent: Mar. 5, 2024

(54) DETECTION OF LOSS OF NEUTRAL OR PHASE

(71) Applicant: SAGEMCOM ENERGY & TELECOM SAS, Rueil Malmaison (FR)

(72) Inventors: Pierre Lhuillier, Rueil Malmaison (FR); Sébastien Saint-Leger, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 18/342,521

(22) Filed: Jun. 27, 2023

(65) Prior Publication Data

US 2023/0417814 A1    Dec. 28, 2023

(30) Foreign Application Priority Data

Jun. 28, 2022 (FR) .................................... 2206488

(51) Int. Cl.
| | |
|---|---|
| *G01R 31/08* | (2020.01) |
| *G01R 11/25* | (2006.01) |
| *G01R 31/58* | (2020.01) |
| *H02H 5/10* | (2006.01) |

(52) U.S. Cl.
CPC ............ *G01R 31/086* (2013.01); *G01R 11/25* (2013.01); *G01R 31/088* (2013.01); *G01R 31/58* (2020.01); *H02H 5/105* (2013.01)

(58) Field of Classification Search
CPC .... G01R 31/086; G01R 11/25; G01R 31/088; G01R 31/58; H02H 5/105

USPC .......................................................... 361/42
See application file for complete search history.

(56) References Cited

U.S. PATENT DOCUMENTS

| | | | | |
|---|---|---|---|---|
| 6,963,147 B2 * | 11/2005 | Kurokami | ......... | H02M 7/53871 307/154 |
| 7,099,130 B2 * | 8/2006 | Angle | .................... | H02H 3/338 361/42 |
| 7,616,420 B2 * | 11/2009 | Slater | ..................... | H02H 9/042 361/103 |

(Continued)

FOREIGN PATENT DOCUMENTS

| | | | | |
|---|---|---|---|---|
| CA | 3046783 A1 * | 6/2018 | ............. | B60K 6/387 |
| CA | 3172287 A1 * | 1/2022 | ........... | H02H 1/0007 |

(Continued)

*Primary Examiner* — Dharti H Patel
(74) *Attorney, Agent, or Firm* — MUNCY, GEISSLER, OLDS & LOWE, P.C.

(57) ABSTRACT

A method for monitoring a polyphase network includes the steps, repeated regularly, of: acquiring voltage measurements taken by voltage sensors of an item of electrical equipment, and producing current values of electrical parameters; accessing a reference table comprising a list of connection configurations each associated with a distinct combination of reference values of said electrical parameters, the list of connection configurations comprising configurations each corresponding to a combination of connection states for each phase (P1, P2, P3) and for the neutral (N); implementing an exploratory algorithm intended to explore the reference table to identify the current connection configuration.

16 Claims, 7 Drawing Sheets

(56) References Cited

U.S. PATENT DOCUMENTS

| | | | | |
|---|---|---|---|---|
| 8,610,438 B1 * | 12/2013 | Sykora | ............... | G01R 19/22 |
| | | | | 307/64 |
| 11,626,823 B2 * | 4/2023 | Kato | ............... | H01H 47/02 |
| | | | | 318/504 |
| 2004/0264079 A1 * | 12/2004 | Lindahl | ............... | G01R 31/52 |
| | | | | 361/42 |
| 2005/0036249 A1 * | 2/2005 | Harvey | ............... | G01R 31/52 |
| | | | | 361/42 |
| 2008/0007878 A1 * | 1/2008 | Gandolfi | ............... | H02H 3/14 |
| | | | | 361/42 |

FOREIGN PATENT DOCUMENTS

| | | | | | |
|---|---|---|---|---|---|
| CN | 107449979 B | 11/2019 | | | |
| CN | 113607994 A | 11/2021 | | | |
| EP | 2693227 B1 | 9/2019 | | | |
| WO | WO-2007078285 A1 * | 7/2007 | ............ | H02M 7/003 |
| WO | WO-2015/179908 A1 | 12/2015 | | | |

\* cited by examiner

DETECTION OF LOSS OF NEUTRAL OR PHASE

The invention relates to the field of electrical power distribution networks and equipment connected to said networks.

BACKGROUND OF THE INVENTION

A break in the neutral conductor upstream of an electricity meter is the responsibility of the energy supplier and can cause major problems for the electrical equipment in the end customer's installation, located downstream of the electricity meter.

Depending on the impedance on each of the phase conductors downstream of the break in the neutral conductor, the voltage imbalance can be significant. Dangerous voltages may result and possibly destroy the equipment connected in the customer's property.

It is therefore important to be able to detect the occurrence of a loss of neutrality event in a reliable and responsive manner with a view to taking suitable preventive and/or protective measures.

In addition to detecting the loss of neutral, it is also important to detect the loss of at least one phase, particularly in the context of active and reactive maintenance of the electricity network, in order to maximise its quality.

Traditionally, the detection of a loss of neutral is based on the detection of an abnormal imbalance between the line-to-neutral voltages and/or an absence of current on the neutral.

One known prior art method therefore involves detecting a loss of neutral by using a detection criterion based solely on finding an abnormal imbalance between the line-to-neutral voltages. Such a criterion is not sufficiently reliable, in particular because it does not make it possible to distinguish between loss of neutral and loss of a phase.

Another known prior art method uses a detection criterion based on the current in the neutral. This method therefore requires there to be a current-measuring component on the neutral, which represents an additional cost and implies major physical and electrical implementation constraints.

In another known prior art method, implementation involves, in particular, measuring the downstream loads in order to be able to predict the expected voltage imbalance and detect this imbalance when it actually occurs.

However, the effectiveness of this solution is directly linked to the relevance of the measured downstream impedances, which is a limiting factor because the proposed theoretical analysis considers linear loads that are constant over time, which is not necessarily the case in the practical reality in the field.

Moreover, this method is based on a theoretical study of a single meter. However, if the neutral cut-off relates to several meters, each having different (non-correlated) and unbalanced downstream loads, the meters share the same floating neutral, the potential of which is set by the combination of different downstream loads behind all of these meters.

Such a case is shown in FIG. 1. It can be seen that two meters 1a and 1b connected to the same electricity network 2 comprising three phases P1, P2, P3 and a neutral N are affected by the cutting off of the neutral at the break point 4.

The method in question does not allow a loss of neutral to be detected in this configuration. Indeed, in the event that the neutral cut-off relates to a group of meters, the downstream impedance estimate for a given meter only takes into account the loads downstream of said meter. However, the actual load leading to the actual imbalance is the result of the combination of all of the downstream loads of all of the meters in the cluster. This approach therefore makes it impossible to detect the loss of the neutral in this case, because the combination of all of the downstream loads cannot be accessed and is therefore impossible to estimate for a given meter.

The detection of loss of a phase is generally reported when the measured line-to-neutral voltage for the phase in question (between the phase and the neutral) is below a certain predetermined threshold. Indeed, it is commonly accepted that, in the event of a loss of phase, the load downstream of the break point "brings" the phase voltage back to neutral, leading to a line-to-neutral voltage measurement that is, in principle, close to 0V.

However, this simplified approach does not cover all of the practical cases that are likely to be encountered in the field.

Indeed, there may also be loads between phases downstream of the break point, to the extent that the phase that has become the floating phase is established naturally according to the balance of the downstream loads (in relation to the neutral, but also in relation to the phases that are still present), possibly leading to it having a potentially high line-to-neutral voltage value (in absolute terms, it can vary between 0V and Vn, which is the nominal line-to-neutral voltage of the network), and the detectability of the loss of a phase therefore cannot be established with certainty on the basis of the measurement of its line-to-neutral voltage alone.

Furthermore, loss of the neutral and loss of a phase may occur at the same time, and the detection of the latter becomes even more problematic in this case if it is established solely on the basis of the measurement of its line-to-neutral voltage.

Finally, it should be added that some prior art methods for detecting a loss of neutral and/or of one or more phases use the comparison with one (or several) reference value(s) established on the basis of measurements taken before the occurrence of physical breaks in conductors as a criterion.

This poses several potential problems. Firstly, once the break in the neutral and/or phase or phases has occurred, the actual conditions (voltages) of the electricity network become inaccessible to measurement, and the criteria for comparison are therefore stuck at the value obtained at the last instant before the break or breaks occurred. If it is considered that the voltages of an electricity network are relatively stable over time, the break may last sufficiently long for the actual voltages of the electricity network to end up differing significantly from the last known measurements, making the comparison criteria obsolete and therefore potentially making detections less reliable over time. Also, the loss of a conductor (neutral or phase) may occur suddenly, but may also develop slowly, with the line impedance drifting until it is so high that it is similar to the loss of the conductor. In this case, the gradual increase in line impedance may take place over a fairly long period of time (several seconds, minutes, etc.). This means that, as the break is not sudden, the comparison criterion (which is normally based on the conditions measured on the network (network voltage) before the conductor(s) break(s)) can no longer be clearly established, making the implementation less reliable and much more problematic.

OBJECT OF THE INVENTION

The object of the invention is a method for detecting a loss of neutral and/or at least one phase of an electricity network which does not have the drawbacks of the prior art methods described above.

SUMMARY OF THE INVENTION

In order to achieve this aim, a method for monitoring a polyphase electricity network is proposed, implemented at least partially in a processing unit of an item of electrical equipment connected to the polyphase electricity network, and comprising the steps, repeated regularly, of:
  acquiring voltage measurements taken by voltage sensors of the item of electrical equipment that are connected to the polyphase electricity network;
  producing current values of electrical parameters from the voltage measurements;
  accessing a reference table that comprises a list of connection configurations each associated with a distinct combination of reference values of said electrical parameters, the list of connection configurations comprising first connection configurations each corresponding to a distinct combination of connection or disconnection states for each phase and for the neutral;
  implementing an exploratory algorithm intended to explore the reference table to identify the connection configuration associated with the current values of the electrical parameters.

The monitoring method according to the invention therefore consists in producing current values of electrical parameters, which are obtained solely from voltage measurements, then exploring a reference table and identifying the connection configuration that corresponds to the current values of the electrical parameters. The reference table may contain reference values of the electrical parameters associated with all of the possible cases: different combinations of normal connection or cut-off states for the lines, different impedance values downstream of the cut-off, inversion of phase and neutral, phase disconnected but brought to the potential of another phase, etc.

The systematic and exhaustive exploration of the table allows the connection configuration to be deduced in a very accurate and very reliable manner.

The monitoring method does not require a current measurement and does not require estimation of the impedances downstream of the loss of the neutral or a phase. The monitoring method makes it possible, in particular, to distinguish between loss of the neutral and loss of a phase. It is functional regardless of the number of meters connected to the cut line. It does not require the use of reference values established on the basis of measurements taken before the occurrence of physical breaks in the conductors.

Also proposed is a monitoring method as previously described, in which the list of connection configurations comprises second connection configurations each corresponding, for one of the phases, to an inversion of the neutral and said phase.

Also proposed is a monitoring method as previously described, in which the list of connection configurations comprises third connection configurations each corresponding to one of the phases that is disconnected and that is at the potential of another phase.

Also proposed is a monitoring method as previously described, in which the implementation of the exploratory algorithm comprises the steps of:

testing a connection configuration, by checking whether predetermined criteria associated with said connection configuration are fulfilled, the predetermined criteria being defined based on the electrical parameters;
  if the predetermined criteria are fulfilled, deducing therefrom that said connection configuration is that which corresponds to the current values of the electrical parameters,
  if not, repeating the testing step with another connection configuration.

Also proposed is a monitoring method as previously described, in which the electrical parameters comprise:
  measured line-to-neutral voltages, each measured line-to-neutral voltage being representative of an amplitude of a line-to-neutral voltage between one of the phases and the neutral; and/or
  measured line-to-line voltages, each measured line-to-line voltage being representative of an amplitude of a line-to-line voltage between two distinct phases; and/or
  measured angles, each measured angle being equal to an angle between a vector representation of a line-to-neutral voltage between one phase and the neutral, and a vector representation of a line-to-neutral voltage between another phase and the neutral.

Also proposed is a monitoring method as previously described, in which the measured angles are obtained by implementing a zero-crossing detection method on the voltages measured between the phases and the neutral.

Also proposed is a monitoring method as previously described, in which the exploratory algorithm implemented is a first exploratory algorithm that only uses the measured line-to-neutral voltages and the measured line-to-line voltages as electrical parameters.

Also proposed is a monitoring method as previously described, in which the first exploratory algorithm comprises the step of attempting to detect one or more measured line-to-line voltages that are abnormal, the first exploratory algorithm then consisting in testing sets of connection configurations, which are defined as a function of the number of abnormal measured line-to-line voltages.

Also proposed is a monitoring method as previously described, in which the measured line-to-line voltage $U'_i$ is considered to be abnormal if:

$$U'_i < U\text{prev}_i - \alpha \text{ or if } U'_i > U\text{prev}_i + \alpha,$$

where:
  $\alpha$ is a margin of uncertainty,
and where:

$$U\text{prev}_i = V_n \cdot \text{SQRT}(ai^2 + aj^2 + ai \cdot aj),$$

where $ai = V_i/V_n$, $aj = V_j/V_n$, $V_i$ is the measured line-to-neutral voltage for the phase Pi, $V_j$ is the measured line-to-neutral voltage for the phase Pj, and $V_n$ is a nominal line-to-neutral voltage.

Also proposed is a monitoring method as previously described, in which the predetermined criteria comprise comparisons each made between:
  a resulting voltage obtained by adding:
    two different measured line-to-neutral voltages; or
    a measured line-to-neutral voltage and a measured line-to-line voltage;
  and a measured line-to-neutral voltage or a measured line-to-line voltage.

Also proposed is a monitoring method as previously described, in which the exploratory algorithm implemented is a second exploratory algorithm that only uses the measured line-to-neutral voltages and the measured angles as electrical parameters.

Also proposed is a monitoring method as previously described, in which the predetermined criteria, associated with the following connection configurations, only comprise comparisons between the measured angles and angular thresholds:

the neutral and all the phases are normally connected;
the neutral is inverted with one of the phases;
the neutral is disconnected and all the phases are connected.

Also proposed is a monitoring method as previously described, in which the second exploratory algorithm tests whether the phases are wired to the meter in a direct or indirect order.

Also proposed is an item of electrical equipment comprising voltage sensors and a processing unit in which the monitoring method as previously described is implemented.

Also proposed is an item of electrical equipment as previously described, the item of electrical equipment being a meter.

Also proposed is a computer program comprising instructions that cause the processing unit of the item of electrical equipment as previously described to perform the steps of the monitoring method as previously described.

Also proposed is a computer-readable storage medium on which the previously described computer program is stored.

The invention shall be better understood in the light of the following description of specific and non-limiting embodiments of the invention.

BRIEF DESCRIPTION OF THE DRAWINGS

Reference is made to the appended drawings in which.

DETAILED DESCRIPTION OF THE INVENTION

Figure 1:
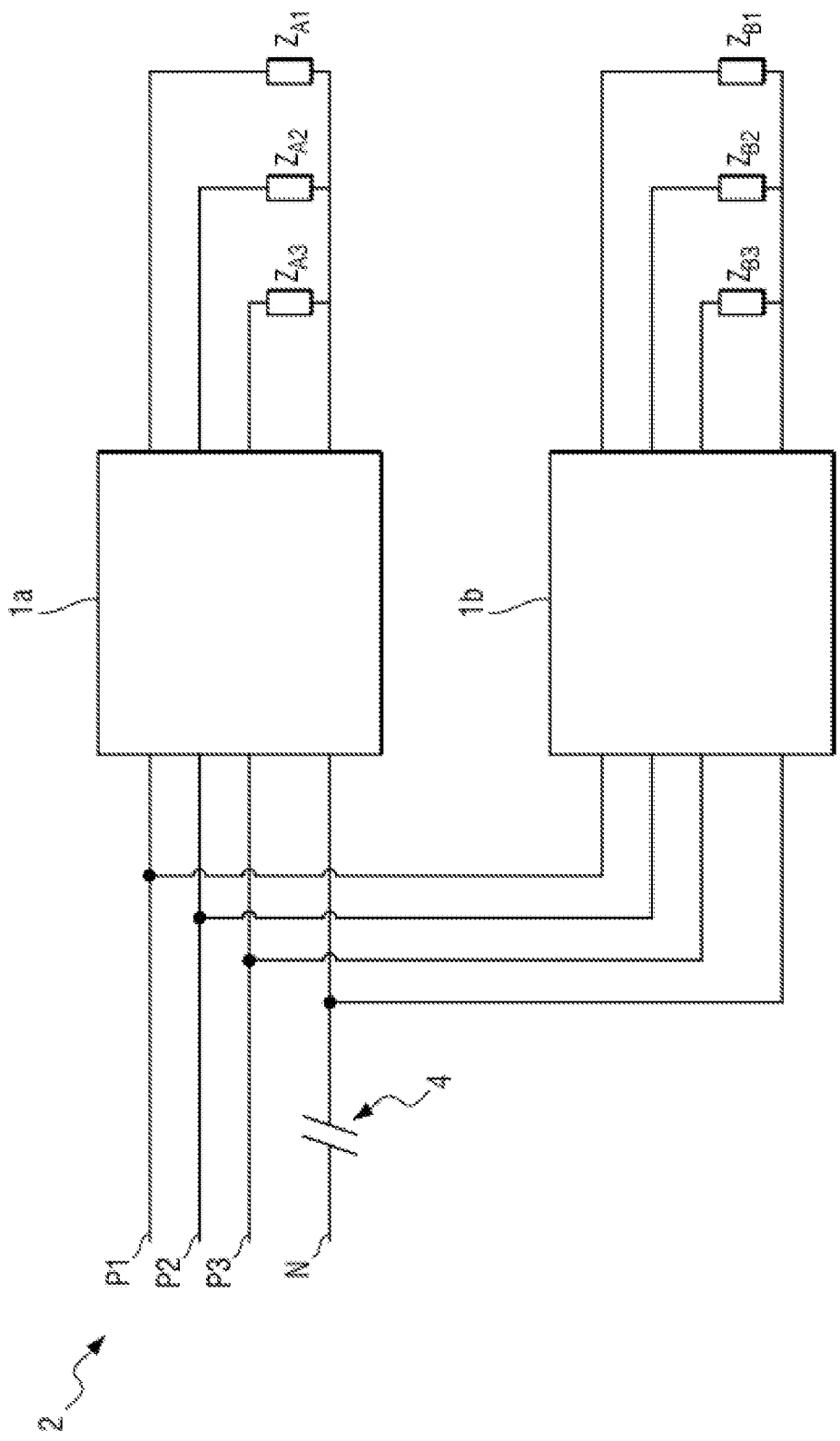
FIG. 1 shows two electricity meters connected to a network in which the neutral has been cut.
Figure 2:
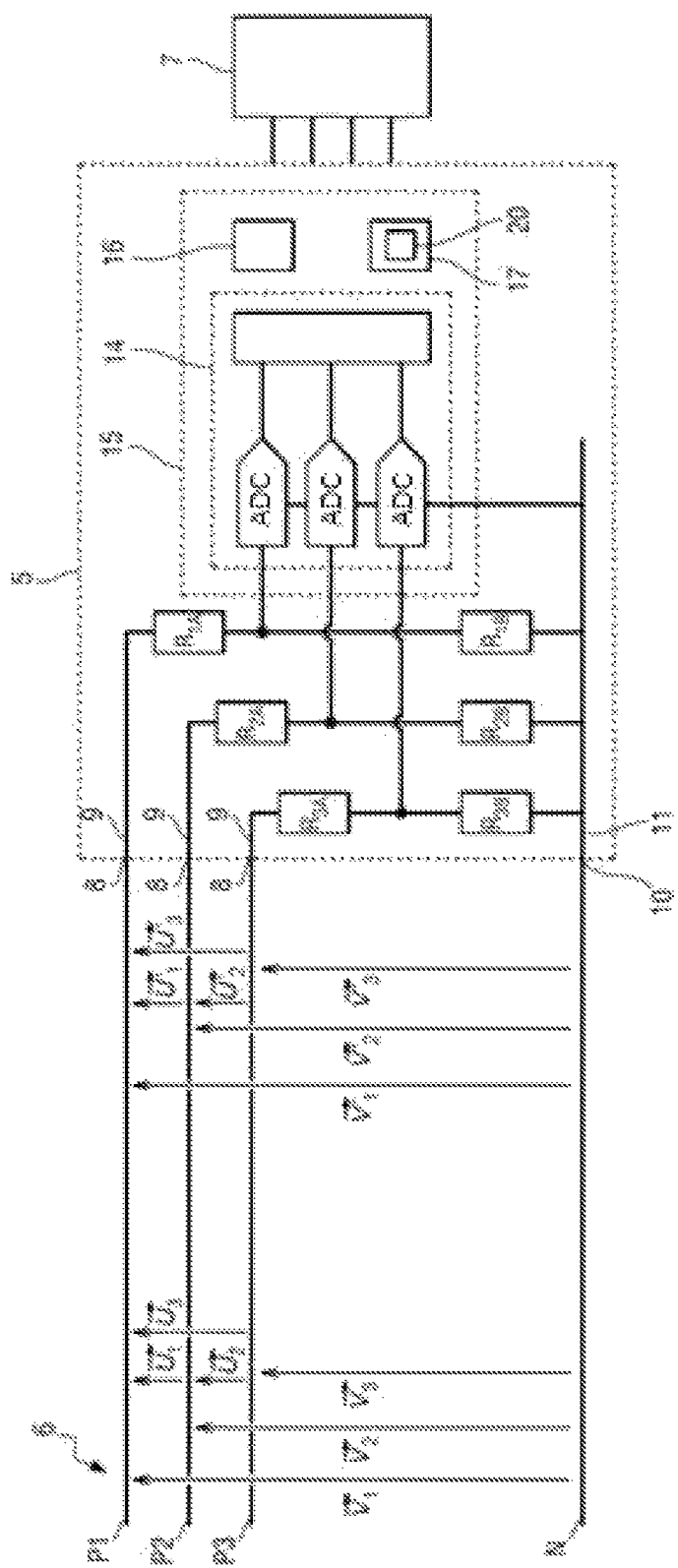
FIG. 2 shows an electricity meter in which the invention is implemented.

In reference to FIG. 2, a polyphase (in this case three-phase) electricity meter 5 is connected to a polyphase (in this case three-phase) electricity network 6 comprising three phases P1, P2, P3 and a neutral N. The meter 5 is intended to measure the electrical power distributed by the electricity network 6 to a user's installation 7.

The electricity meter 5 comprises, for each phase Pi (i ranging from 1 to 3), a terminal 8 connected to said phase Pi and a phase conductor 9 connected to said terminal 8. The electricity meter 5 also comprises a terminal 10 connected to the neutral N and a neutral conductor 11 connected to the terminal 10.

The meter 5 further comprises voltage sensors that are connected to the electricity network 6 via the phase 9 and neutral 11 conductors, and via the terminals 8 and 10. The voltage sensors can be used to measure:

the line-to-neutral voltage V'1 between the phase P1 and the neutral N, which is (normally) the image, at the meter 5, of the line-to-neutral voltage V1 of the network 6;

the line-to-neutral voltage V'2 between the phase P2 and the neutral N, which is (normally) the image, at the meter 5, of the line-to-neutral voltage V2 of the network 6;

the line-to-neutral voltage V'3 between the phase P3 and the neutral N, which is (normally) the image, at the meter 5, of the line-to-neutral voltage V3 of the network 6.

The voltage sensors comprise a first resistive bridge, a second resistive bridge, a third resistive bridge and an analogue-to-digital converter 14 (ADC).

The first resistive bridge comprises two resistors $R_{1A}$ and $R_{1B}$ mounted between the phase conductor 9 connected to the phase P1 and the neutral conductor 11. The second resistive bridge comprises two resistors $R_{2A}$ and $R_{2B}$ mounted between the phase conductor 9 connected to the phase P2 and the neutral conductor 11. The third resistive bridge comprises two resistors $R_{3A}$ and $R_{3B}$ mounted between the phase conductor 9 connected to the phase P3 and the neutral conductor 11.

The ADC 14 comprises a first input connected to a point situated between the two resistors $R_{1A}$ and $R_{1B}$, a second input connected to a point situated between the two resistors $R_{2A}$ and $R_{2B}$, and a third input connected to a point situated between the two resistors $R_{3A}$ and $R_{3B}$.

The resistive bridges allow the amplitude of the measured voltages to be reduced so that they are compatible with the measurement range of the ADC 14. The ADC 14 digitizes the measured voltages.

The characteristics of the ADC 14 (number of bits, sampling frequency) are compatible with the need to produce usable voltage measurements. Typically, the ADC 14 that is used is a ADC with 12 or more bits and a sampling frequency of 1 ksps.

The electricity meter 5 also comprises a processing unit 15.

The processing unit 15 comprises one or more processing components 16 and, for example, any general-purpose or specialized processor or microprocessor, (for example a DSP (Digital Signal Processor), a microcontroller or indeed a programmable logic circuit such as an FPGA (Field-Programmable Gate Array) or an ASIC (Application-Specific Integrated Circuit)).

The processing unit 15 also comprises memories 17. At least one of these memories 17 forms a computer-readable storage medium on which at least one computer program is stored comprising instructions that cause the processing unit 15 to perform at least some of the steps of the monitoring method according to the invention. One of these memories 17 may be integrated into one of the processing components 16.

In this instance, the ADC 14 is integrated into the processing unit 15, and optionally into one of the processing components 16.

The processing unit 15 therefore acquires the measurements of the line-to-neutral voltages V'1, V'2, V'3 and produces, from these voltage measurements, measurements of:

the line-to-line voltage U'1 between the phase P1 and the phase P2, which is (normally) the image, at the meter 5, of the voltage U1 of the network 6;

the line-to-line voltage U'2 between the phase P2 and the phase P3, which is (normally) the image, at the meter 5, of the voltage U2 of the network 6;

the line-to-line voltage U'3 between the phase P3 and the phase P1, which is (normally) the image, at the meter 5, of the voltage U3 of the network 6.

Each of these line-to-line voltages, at each sampling time, is obtained by subtracting the two line-to-neutral voltages of the phases in question.

The voltages considered hereinafter are:

measured line-to-neutral voltages, each measured line-to-neutral voltage being representative of an amplitude of a line-to-neutral voltage between one of the phases and the neutral;

measured line-to-line voltages, each measured line-to-line voltage being representative of an amplitude of a line-to-line voltage between two distinct phases.

In this instance, the measured line-to-neutral voltages and the measured line-to-line voltages are root mean square voltages—but the voltages representative of the amplitudes could be different, for example maximum amplitude values.

The voltages considered hereinafter are therefore root mean square voltages calculated (and possibly corrected by calibration parameters) on the basis of the samples of the line-to-neutral voltage measurements (for example, each second on the basis of the samples of the previous second, or over a sliding-second window, or over another time depth that is deemed appropriate).

The processing unit 15 therefore estimates the measured line-to-neutral voltages $V'_1$ (which is the root mean square voltage of the voltage $\vec{V'_1}$), $V'_2$ and $V'_3$, and the measured line-to-line voltages $U'_1$ (which is the root mean square voltage of the voltage $\vec{U'_1}$), $U'_2$ and $U'_3$.

The processing unit also estimates measured angles $Phi_1$, $Phi_2$ and $Phi_3$. Each measured angle is equal to an angle between a vector representation of a line-to-neutral voltage between one phase and the neutral, and a vector representation of a line-to-neutral voltage between another phase and the neutral.

Therefore, $Phi_1$ is the angle between $\vec{V'_1}$ and $\vec{V'_2}$, $Phi_2$ is the angle between $\vec{V'_2}$ and $\vec{V'_3}$, $Phi_3$ is the angle between $\vec{V'_3}$ and $\vec{V'_1}$.

The measured angles are estimated by implementing a zero-crossing detection method and appropriate filtering on the voltage measurements—and in particular on the measured line-to-neutral voltages.

The invention aims to detect a loss of neutral and/or of one or more phases, based solely on the analysis of the voltage measurements taken by the electricity meter 5, and without using reference measurements prior to the time a break occurs in one or more conductors from the network.

Figure 3:
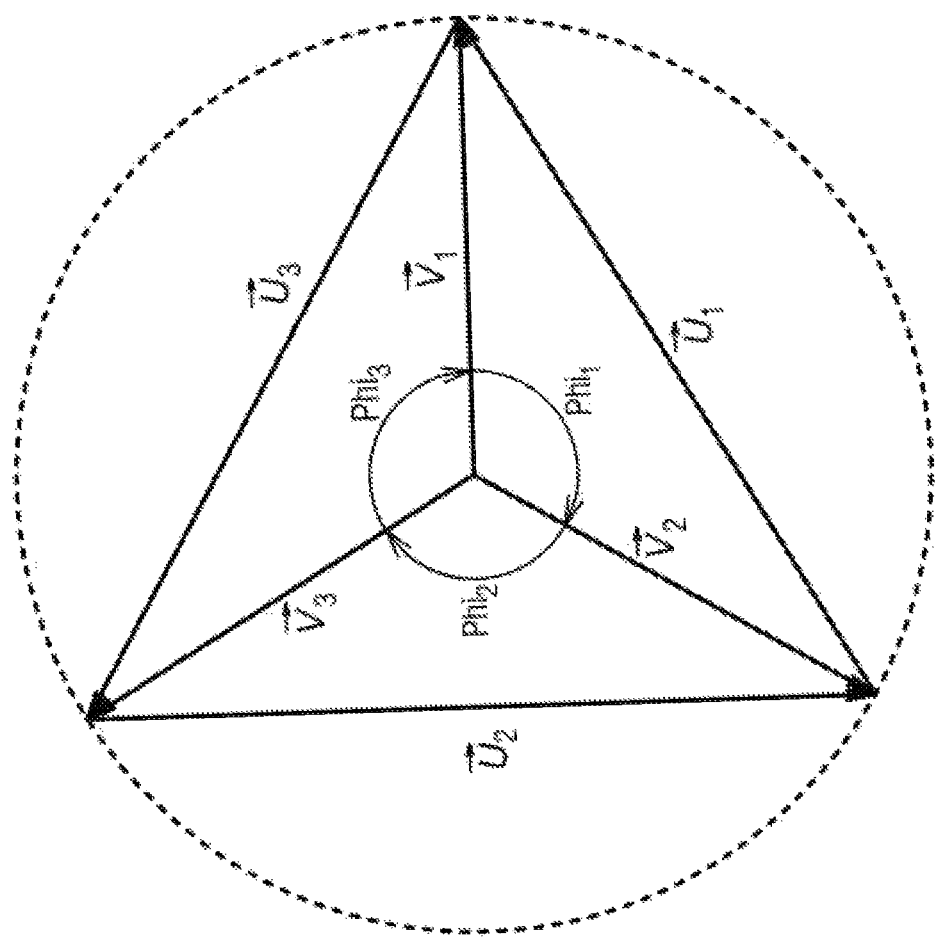
FIG. 3 shows a Fresnel diagram in the nominal case, without loss of neutral.

FIG. 3 shows the Fresnel diagram in the nominal case, when the neutral is present and with the line-to-neutral voltages $\vec{V_1}, \vec{V_2}, \vec{V_3}$ balanced. The vectors $\vec{U_1}, \vec{U_2}, \vec{U_3}$ and the angles $Phi_1$, $Phi_2$ and $Phi_3$ can also be seen.

Figure 4:
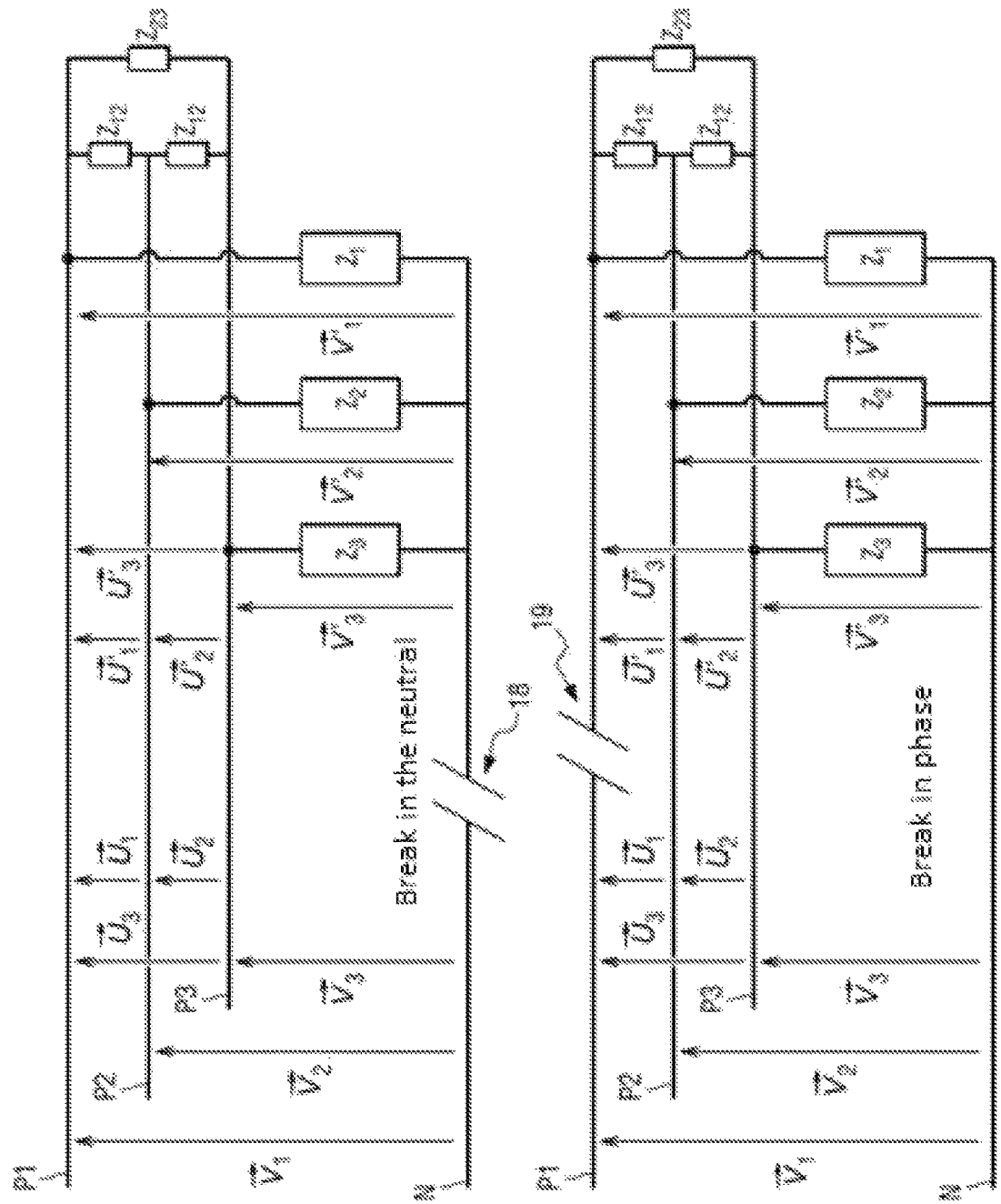
FIG. 4 comprises a first diagram showing a neutral cut-off on the network, and a second diagram showing a cut-off of the phase P1.

The top diagram in FIG. 4 shows and models the situation occurring after a loss of neutral (cutting off of the neutral). The break point 18 of the neutral N is assumed to be located upstream of the meter 5. The neutral line situated downstream of the break point 18 becomes a floating line and is established according to the loads situated downstream of the break point connected to it ($Z_1$, $Z_2$, $Z_3$, $Z_{12}$, $Z_{12}$, $Z_{23}$). In this example, the term "upstream" means on the network 6 side, and the term "downstream" means on the installation 7 side.

The bottom diagram in FIG. 4 shows and models the situation occurring after a loss of the phase P1 (cutting off of the phase). The break point 19 of the phase P1 is assumed to be located upstream of the meter 5. The phase line situated downstream of the break point 19 becomes a floating line and is established according to the loads situated downstream of the break point connected to it. In this specific case, it can be seen that the measured voltages $V'_2$, $V'_3$ and $U'_2$ correspond to the actual voltages of the network ($V_2$, $V_3$ and $U_2$). However, the measured voltages $V'_1$, $U'_1$ and $U'_3$ are no longer those of the network (V1, U1 and U3) except in the specific case of perfectly balanced downstream loads.

Although this situation is not shown in FIG. 4, two break points may also be considered (on one phase and the neutral, or indeed on two phases). Similarly, the voltage on each of the two lines that have become floating lines is established according to the loads situated downstream of the break points that are respectively connected to them.

Figure 5:
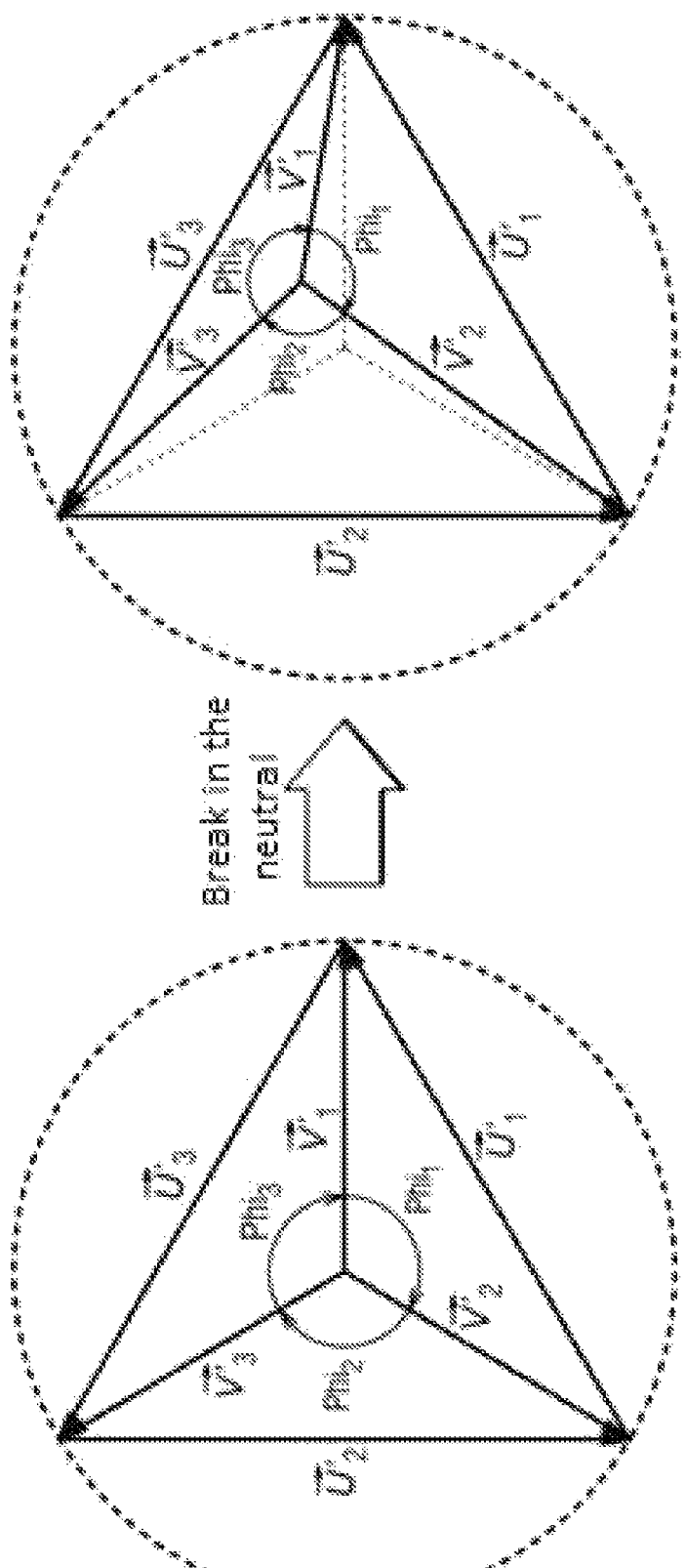
FIG. 5 shows the effect, downstream of the break point, of the loss of the neutral on the Fresnel diagram.

In reference to FIG. 5, following the loss of the neutral N, for example, the voltages naturally balance according to the downstream loads: in the Fresnel diagram, the position of the neutral that has become a floating neutral downstream of the break point is located "somewhere" within the triangle formed by the three phases, depending on the values of the downstream loads.

Therefore, it can be seen in FIG. 5 that, in the event that neutral is lost, the measured line-to-line voltages correspond to the actual line-to-line voltages of the network ($U'_x = U_x$). However, the measured line-to-neutral voltages are no longer those of the network ($V'_x \neq V_x$), except in the specific case of perfectly balanced downstream loads. It should be noted that FIG. 5 depicts this situation with a hypothetical imbalance of the downstream loads.

The monitoring method according to the invention consists in detecting a cutting off of the neutral and/or one or several phases, based only on the voltage measurements.

The invention first comprises a preliminary step that consists in systematically and exhaustively listing and studying the different possible cases, and defining, for each of the connection configurations considered, the expected values of electrical parameters obtained from the voltage measurements.

A reference table 20 is therefore created (see FIG. 2), which comprises a list of connection configurations each associated with a distinct combination of reference values of said electrical parameters.

The list of connection configurations comprises first connection configurations each corresponding to a distinct combination of connection (normal) or disconnection (cut-off) states for each phase Pi and for the neutral N.

For example, a first connection configuration corresponds to the combination:

N: OFF—P1: ON—P2: ON—P3: ON, where "OFF" means that the line in question (phase or neutral) is disconnected and therefore has a cut-off, and where "ON" on the contrary means that the connection is normal.

Other first connection combinations are, for example:

N: ON—P1: OFF—P2: ON—P3: ON,
N: ON—P1: OFF—P2: OFF—P3: ON,
etc.

The list of connection configurations also comprises second connection configurations each corresponding, for one of the phases, to an inversion of the neutral and said phase at the terminals 8 and 10 of the meter 5. The inversion results, for example, from incorrect workmanship when installing the meter 5.

For example, a second connection configuration corresponds to the combination:

N: ON (invert)—P1: ON (invert)—P2: ON—P3: ON.

In this second connection configuration, the neutral and the phase P1 are not cut but are inverted.

The list of connection configurations also comprises third connection configurations each corresponding to one of the phases which is disconnected and which, owing to the conditions of downstream loads, is brought to the potential of another phase.

For example, a third connection configuration corresponds to the combination:

N: ON—P1: OFF (ON)—P2: ON—P3: ON.

In this third connection configuration, the phase P1 is cut but is brought to the potential of one of the phases P2 or P3.

Figure 6:
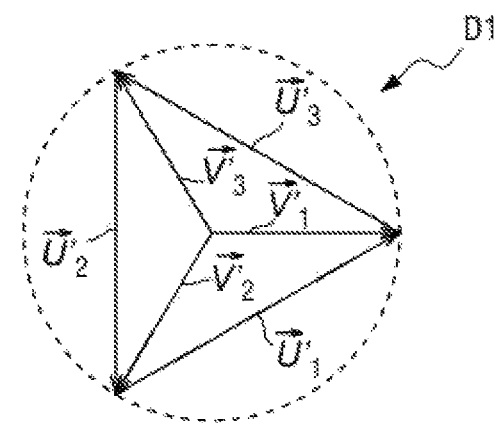
FIG. 6 shows the result, on the voltages shown in Fresnel diagrams, of different connection configurations.
Figure 6:
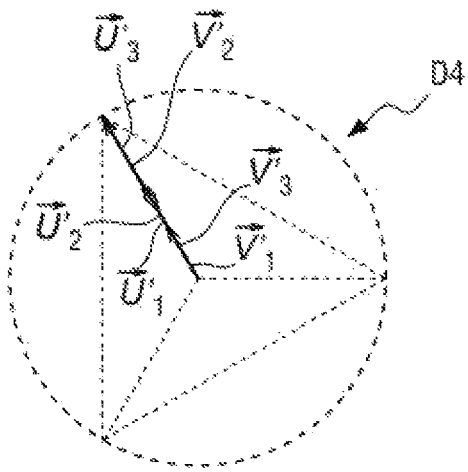
Figure 6:
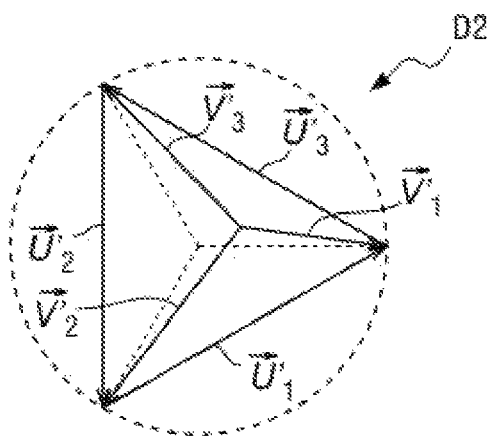
Figure 6:
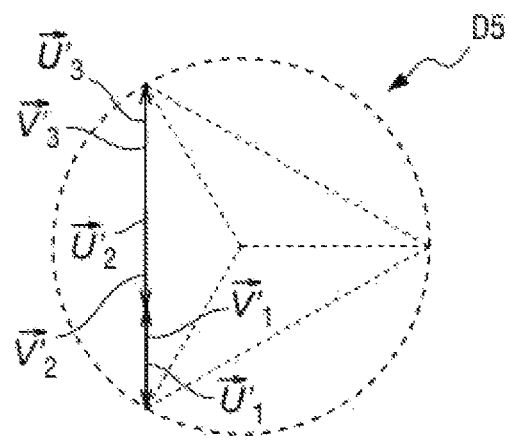
Figure 6:
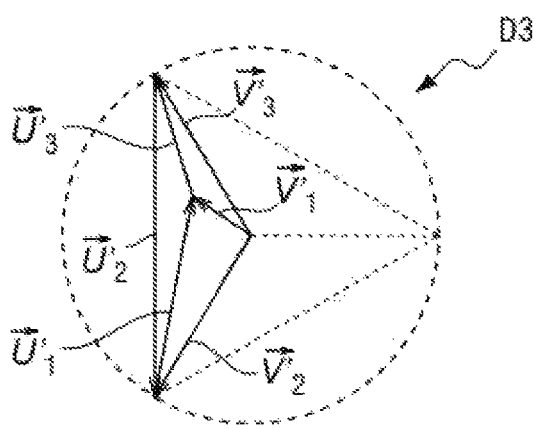
Figure 6:
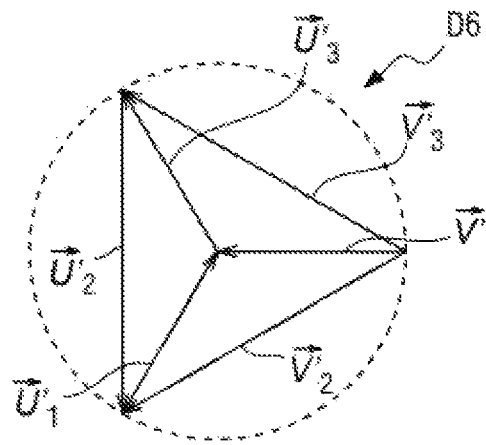

FIG. 6 shows a certain number of connection configurations:

in diagram D1, all of the lines N, P1, P2, P3 are connected (nominal conditions), or indeed the neutral N is disconnected but the loads are balanced;

in diagram D2, the neutral N is disconnected and the loads are unbalanced;

in diagram D3, the phase P1 is disconnected;

in diagram D4, the phase P1 and the phase P2 are disconnected;

in diagram D5, the neutral N and the phase P1 are disconnected;

in diagram D6, the neutral N and the phase P1 are inverted.

In the reference table 20 mentioned above, the electrical parameters used comprise:

the measured line-to-neutral voltages, each measured line-to-neutral voltage being representative (as already seen) of an amplitude of a line-to-neutral voltage between one of the phases and the neutral; and/or measured line-to-line voltages, each measured line-to-line voltage being representative (as already seen) of an amplitude of a line-to-line voltage between two distinct phases; and/or measured angles, each measured angle being equal (as already seen) to an angle between a vector representation of a line-to-neutral voltage between one phase and the neutral, and a vector representation of a line-to-neutral voltage between another phase and the neutral.

The reference table 20 has therefore been created in a design department, laboratory or factory, and has been downloaded to one of the memories 17 of the processing unit 15. Alternatively, the reference table 20 may be stored remotely (in a data concentrator, a server of the computer system, in the Cloud, etc.), and the processing unit 15 of the meter 5 may access it via suitable communication means. The reference table 20 may be updated while the meter 5 is in operation.

The inventors have therefore analysed the reference table 20, and have deduced from it the exploratory path and discriminating criteria for reliably determining, during operation, the present connection configuration—and, in particular, the presence or absence of the neutral N and the phases Pi.

An example of a reference table is provided in Annex 1 of the present description.

The reference table 20 lists, in a virtually exhaustive manner, the different practical cases, and indicates the characteristics of each of these cases (position of each line in the Fresnel reference diagram, values of the line-to-neutral voltages and line-to-line voltages, angles between phases). However, the table in the Annex is limited, for the sake of simplicity and readability, to equal and nominal line-to-neutral voltages ($V_1=V_2=V_3=V_n$), and to phases wired in a direct order.

The table in the Annex shows, in bold print, generic cases for a given connection case, and, in standard print, specific cases (typically when the conditions of downstream loads are such that a disconnected line is brought to the same potential as another line).

Careful analysis and systematic study have shown that, based solely on the measured line-to-neutral voltages, and/or the measured line-to-line voltages and/or the differences in phase angles, it is possible to distinguish between each of these cases, and therefore to deduce with certainty which is the current case and finally which lines (neutral and/or phase(s)) are present or lost.

A suitable algorithm which iteratively explores the different possible configurations and checks at each step whether the criteria (line-to-neutral voltages and line-to-line voltages and/or line-to-neutral voltages and angles) corresponding to the particular configuration concerned are fulfilled is then used.

Figure 7:
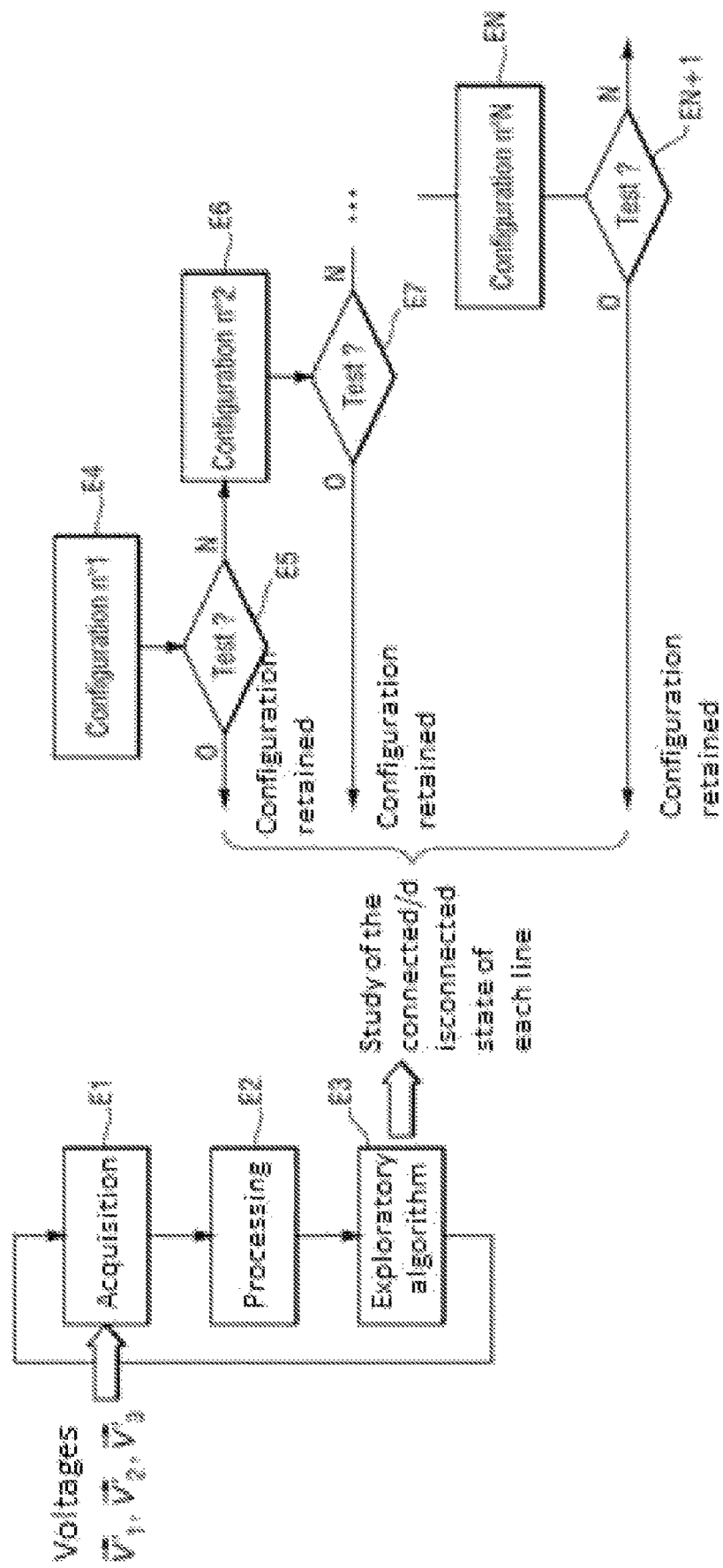
FIG. 7 shows steps of the monitoring method according to the invention.

In reference to FIG. 7, the monitoring method according to the invention therefore consists, for the processing unit 15, in acquiring voltage measurements taken by the voltage sensors of the meter 5: step E1.

The voltage measurements are then processed to produce the current values of the electrical parameters: calculation of the measured line-to-neutral voltages, the measured line-to-line voltages, the differences in phase angles, etc.: step E2.

The processing unit 15 then accesses the reference table 20 and implements an exploratory algorithm, intended to search the reference table to identify the connection configuration associated with the current values of the electrical parameters: step E3.

The exploratory algorithm allows the current state to be classified on the basis of the current values of the electrical parameters, from among multiple and exhaustive study cases. The exploratory algorithm allows a systematic and exhaustive exploration of the reference table and therefore of all of the expected study cases according to the different possible connection configuration cases.

The input information of the exploratory algorithm therefore consists of the current values of the electrical parameters. At the output of this exploratory algorithm, it is reported which line(s) (neutral and/or phase(s)) are connected or disconnected.

This mechanism for detecting loss of neutral and/or of one or more phases is implemented continuously (for example in a loop, every second, when new voltage measurement values are available).

The exploratory algorithm then comprises the steps of:

testing a connection configuration, by checking whether predetermined criteria associated with said connection configuration are fulfilled, the predetermined criteria being defined based on the electrical parameters;

if the predetermined criteria are fulfilled, deducing therefrom that said connection configuration is that which corresponds to the current values of the electrical parameters, if not, repeating the testing step with another connection configuration.

The exploratory algorithm acquires first predetermined criteria, associated with a connection configuration number 1, corresponding to a first hypothesis of the state of the lines (phases and neutral): step E4.

The exploratory algorithm tests whether these first predetermined criteria are fulfilled: step E5. If this is the case, the exploratory algorithm deduces from this that the current connection configuration corresponds to connection configuration number 1.

If not, the exploratory algorithm acquires second predetermined criteria, associated with a connection configuration number 2, corresponding to a second hypothesis of the state of the lines (phases and neutral): step E6.

The exploratory algorithm tests whether these second predetermined criteria are fulfilled: step E7. If this is the case, the exploratory algorithm deduces from this that the current connection configuration corresponds to connection configuration number 2.

These steps are repeated a certain number of times. At the Nth iteration, the exploratory algorithm acquires Nth predetermined criteria (step EN) and tests a connection configuration number N, corresponding to an Nth hypothesis of the state of the lines: step EN+1.

If the Nth predetermined criteria are fulfilled, the exploratory algorithm deduces from this that the current connection configuration corresponds to connection configuration number N. If not, the exploratory algorithm deduces from this that the connection configuration corresponds to an unknown connection case.

The number N is the number of different connection configurations listed in the reference table 20.

The exploratory algorithm will now be described in greater detail.

First of all, a first exploratory algorithm will be described. The first exploratory algorithm uses only the measured line-to-neutral voltages and the measured line-to-line voltages as electrical parameters.

The first exploratory algorithm, written in pseudo-language and therefore easily transcribed to all major computer languages, is provided in Annex 2.

The first exploratory algorithm first comprises a preliminary part defining a plurality of parameters and, in particular, a very low voltage threshold Voff. This threshold, with which the measured line-to-neutral voltages are compared, corresponds to a voltage so low that said voltage may be considered to an absence of phase.

The first exploratory algorithm then comprises a looping instruction every second. Indeed, as already seen, the steps of the monitoring method are repeated regularly: at regular intervals (of 1 second in this instance), the processing unit 15 acquires new voltage measurements and produces new current values of the electrical parameters. The first exploratory algorithm is therefore repeated each second in order to identify the new connection configuration associated with the new current values of the electrical parameters.

The first exploratory algorithm then calculates the expected line-to-line voltages from the measured line-to-neutral voltages, when no line is cut.

The first exploratory algorithm then attempts to detect one or more measured line-to-line voltages that are abnormal.

For the phases Pi and Pj, the measured line-to-line voltage $U'_i$ is considered to be abnormal if:

$$U'_i < U\text{prev}_i - \alpha \text{ or if } U'_i > U\text{prev}_i + \alpha,$$

where:
$\alpha$ is a margin of uncertainty,
and where:

$$U\text{prev}_i = V_n \cdot \text{SQRT}(ai^2 + aj^2 + ai \cdot aj),$$

where $ai = V_i/V_n$, $aj = V_j/V_n$, $V_i$ is the measured line-to-neutral voltage for the phase Pi, $V_j$ is the measured line-to-neutral voltage for the phase Pj, and $V_n$ is a nominal line-to-neutral voltage.

The above formula corresponds to:

$$U_n = \text{SQRT}(3) \cdot V_n$$

which is obtained in the nominal case of voltages that are balanced and at the nominal value. It should be noted that this relationship is exact if, and only if, the angle relationship between phases Pi and Pj is 120°. Non-compliance of the measurement of $U'_i$ with the calculation given above and obtained with the measurements $V'_i$ and $V'_j$ is therefore sufficient to prove that the angle relationship between the phases i and j is not 120°.

The first exploratory algorithm then consists in testing sets of connection configurations, by checking whether predetermined criteria associated with the connection configurations are fulfilled.

In this instance, the predetermined criteria comprise comparisons each made between:
a resulting voltage obtained by adding:
two different measured line-to-neutral voltages; or
a measured line-to-neutral voltage and a measured line-to-line voltage,
and a measured line-to-neutral voltage or a measured line-to-line voltage.

The configuration sets are defined as a function of the number of abnormal measured line-to-line voltages.

Thus, if the number of abnormal measured line-to-line voltages is equal to zero, the first exploratory algorithm considers, by default, that the current connection configuration, over time T, is a nominal connection configuration, in which the neutral and the phases are connected normally, then tests connection configurations in which at least one phase is disconnected.

The first exploratory algorithm therefore first considers, by default, that the neutral and the three phases are connected normally.

The first exploratory algorithm then attempts to detect one or more disconnected phases, by comparing, for each phase Pi, the measured line-to-neutral voltage $V'_i$ with the threshold Voff. If, for a phase Pi, the measured line-to-neutral voltage is strictly less than Voff, said phase Pi is considered to be disconnected.

If the number of abnormal measured line-to-line voltages is equal to one, the first exploratory algorithm considers, by default, that the current connection configuration is a nominal connection configuration, then tests connection configurations in which a single phase is disconnected, and connection configurations in which a phase is disconnected and is brought to the potential of another phase.

The first exploratory algorithm therefore considers, by default, that the neutral and the three phases are normally connected.

Then, for each phase Pi, the algorithm checks whether:

$$V'i + U'i = V'j, \text{ or whether } V'i + U'k = V'k \text{ (in which } j = i+1 \text{ and } k = i+2).$$

If this is the case, the algorithm deduces from this that the phase Pi is disconnected.

If the algorithm has detected that the phase Pi is disconnected, the algorithm checks whether:

$$V'i=V'j \text{ or whether } V'i=V'k.$$

If this is the case, it deduces from this that the phase Pi is connected to another phase.

If the number of abnormal measured line-to-line voltages is equal to two, the first exploratory algorithm considers, by default, that the current connection configuration is a nominal connection configuration, then tests connection configurations in which a single phase is disconnected (and brought back between the two other phases and the neutral).

The first exploratory algorithm therefore considers, by default, that the neutral and the three phases are normally connected.

Then, for each phase Pi, the algorithm checks whether:

$$V'i<V'j \text{ and } U'i<V'j \text{ or whether}$$

$$V'i<V'k \text{ and } U'k<V'k.$$

If this is the case, the algorithm deduces from this that the phase Pi is disconnected.

If the number of abnormal measured line-to-line voltages is equal to three, the first exploratory algorithm considers, by default, that the current connection configuration is a connection configuration in which the neutral only is cut (and in which there is clearly a significant imbalance in the downstream loads), then tests connection configurations in which one phase and the neutral are cut (and brought back between the two other phases), then a connection configuration in which one phase is connected to another phase, then connection configurations in which two phases are cut (brought back between the neutral and the remaining phase), then a connection configuration in which three phases are connected to each other, then connection configurations in which one phase is inverted with the neutral.

The first exploratory algorithm first considers, by default, that the neutral is disconnected and the three phases are correctly connected.

Next, for each phase Pi, the algorithm checks whether:

$$V'j+V'k=U'j \text{ and } U'i+U'k=U'j$$

If this is the case, the algorithm deduces from this that the phase Pi is disconnected.

If the algorithm has detected that the phase Pi is disconnected, it checks whether:

$$U'i=U'j \text{ or whether } U'k=U'j.$$

If this is the case, it deduces from this that the phase Pi is connected to another phase.

Next, the algorithm attempts to detect the loss of two phases only (brought back between the neutral and the remaining phase).

For each phase Pi, the algorithm checks whether:

$$V'i+U'k=V'k \text{ and } V'j+U'j=V'k$$

If this is the case, the algorithm deduces from this that the phase Pi and the phase Pj are disconnected.

If the algorithm has detected that the phase Pi and the phase Pj are disconnected, the algorithm checks whether:

$$V'i=V'j \text{ and whether } V'i=V'k.$$

If this is the case, it deduces from this that the three phases are connected together.

Next, the algorithm attempts to detect an inversion of the neutral and one phase in the wiring of the meter 5.

For each phase Pi, the algorithm calculates the expected line-to-line voltages Uprev_inv[i], Uprev_inv[j], Uprev_inv[k] knowing the measured line-to-neutral voltages and assuming an inversion of the neutral and the phase Pi.

If the following applies:

$$U\text{prev\_inv}[i]=V'j \text{ and } U\text{prev\_inv}[j]=U'j \text{ and } U\text{prev\_inv}[k]=V'k,$$

the algorithm deduces from this that the neutral and the phase Pi are inverted.

Next, for each phase Pi, the algorithm compares the line-to-neutral voltage V'i with predetermined thresholds in order to assign a status concerning the voltage levels coming from the network: overvoltage, undervoltage, significant undervoltage, dangerous overvoltage, etc.

The algorithm also assigns a status to the dangerousness of the voltage level on the downstream side, and possibly controls the opening of the breakers in order to protect the equipment connected downstream of the meter 5 (equipment of the installation 7).

It should be noted that all of these comparisons can be made by adding margins allowing uncertainties to be taken into account; for example, as shown in the first exploratory algorithm provided in Annex 2, rather than checking whether:

$$V'i+U'i=V'j \text{ or } V'i+U'k=V'k,$$

the following is checked:

$$V'i+U'i=V'j+/-(2\cdot Y) \text{ or } V'i+U'k=V'k+/-(2\cdot Y),$$

Y being a margin allowing uncertainty in the voltage measurements to be taken into account.

The first exploratory algorithm (like the second which is described below) therefore provides the margins required to take into account measurement uncertainties and initial tolerances of the electricity network.

A second exploratory algorithm will now be described.

The second exploratory algorithm uses only the measured line-to-neutral voltages and the measured angles as electrical parameters.

The second exploratory algorithm, written in pseudo-language, is provided in Annex 3.

The second exploratory algorithm first comprises a preliminary part defining a plurality of parameters and, in particular, a high angular threshold and a low angular threshold.

The second exploratory algorithm then comprises a looping instruction every second.

The second exploratory algorithm then compares each measured line-to-neutral voltage with the threshold Voff and, if all of the measured line-to-neutral voltages are strictly less than said threshold Voff, the algorithm is inhibited.

For each phase Pi, if the line-to-neutral voltage measured on the phase Pi is strictly less than the predetermined threshold Voff, the measured angles involving said phase are not considered reliable and are set to zero.

The algorithm first tests a nominal connection configuration in which the neutral and the phases are connected normally.

The algorithm compares each measured angle with a reference value Aref and, if the measured angles are all equal to Aref (possibly taking into account a margin of uncertainty), the algorithm deduces from this that the neutral and the three phases are normally connected and that the phases are wired to the meter 5 in a direct order.

If this condition is not met, the algorithm compares each measured angle with a reference value −Aref and, if the measured angles are all equal to −Aref, the algorithm deduces from this that the neutral and the phases are normally connected and that the phases are wired to the meter in a direct order.

The algorithm then tests connection configurations, in each of which one phase is inverted with the neutral.

For this purpose, the algorithm compares each measured angle with the high and low angular thresholds. The predetermined criteria therefore only comprise comparisons between the measured angles and angular thresholds.

Next, the algorithm tests a connection configuration in which a single phase is disconnected, the two other phases and the neutral being normally connected. The predetermined criteria comprise comparisons between the measured angles and angular thresholds, and comparisons between the measured line-to-neutral voltages and voltage thresholds.

If the algorithm has detected a disconnected phase, it then attempts to detect whether said phase has been brought to the potential of one of the other phases.

Next, the algorithm attempts to detect a connection configuration in which the neutral is disconnected, the three other phases still being connected.

Once again, the predetermined criteria only comprise comparisons between the measured angles and angular thresholds.

The algorithm then tests a connection configuration in which two lines are disconnected, the other lines remaining connected.

The predetermined criteria comprise comparisons between the measured angles and angular thresholds, and comparisons between the measured line-to-neutral voltages and voltage thresholds.

The algorithm then attempts to detect a connection configuration in which two phases are disconnected, the neutral and the other phase remaining connected (specific case of the above configuration).

If the algorithm has detected a disconnected phase, it then attempts to detect whether said phase has been brought to the potential of one of the other phases.

The algorithm then attempts to detect a disconnection configuration in which the neutral and one phase are disconnected, the two other phases being normally connected (specific case of the above configuration).

If the algorithm has detected a disconnected phase, it then attempts to detect whether said phase has been brought to the potential of one of the other phases.

Next, the algorithm once more tests a connection configuration in which the neutral and a phase are disconnected, the two other phases being normally connected.

Finally, like the first exploratory algorithm, for each phase Pi, the second exploratory algorithm compares the line-to-neutral voltage V'i with predetermined thresholds in order to assign a status concerning the voltage levels coming from the network: overvoltage, undervoltage, significant undervoltage, dangerous overvoltage, etc.

The algorithm also assigns a status to the dangerousness of the voltage level on the downstream side, and possibly controls the opening of the breakers in order to protect the equipment connected downstream of the meter 5 (equipment of the installation 7).

This invention is therefore based on criteria that are easily measured in the profession (voltage measurements and their processing) and highly deterministic, and it does not require any reference measurements from before the suspected loss of neutral. The voltage measurements taken at time T are sufficient on their own in order to be able to ascertain whether or not a loss of neutral and/or of one or more phases has taken place, because they are sufficient in order to determine the current connection configuration by analysing the corresponding characteristic conditions in the Fresnel diagram.

In the final implementation of the proposed solution, irrespective of the specific embodiment of the method, it is advantageous to allow a suitable margin of uncertainty, relating in particular to the accuracy of the voltage measurements and possibly of angles (typically of +/−1V or +/−1% and +/−2° respectively, depending on the method and the acquisition means), as proposed in the specific embodiments of the exploratory algorithms provided.

Optionally, in order to minimize the risk of false positives, irrespective of the specific embodiment of the method, it may be ascertained that the predetermined detection criteria are fulfilled over several consecutive iterations before reporting an actual loss of neutral and/or of one or more phases.

Optionally, the detection of loss of neutral and/or of one or more phases generates an alarm that is timestamped in one of the memories 17 of the processing unit 15 of the meter 5 and/or, in the case of communicating meters (for example communicating via a transmission channel based on PLC technology or cellular radio technology), an alarm signal may be sent to equipment external to the meter, and, for example, to the remote information system (possibly spontaneously, depending on the high-level protocol used).

Optionally, the detection of loss of neutral and/or of one or more phases generates a specific and dedicated display on the local display of the meter or by means of an indicator light.

Optionally, the detection of loss of neutral and/or of one or more phases generates the emission of a sound signal.

Optionally, on detection of loss of neutral and when the imbalance in the line-to-neutral voltages is considered to be abnormally significant, an alarm signal is generated and timestamped in a memory of the processing unit of the meter and/or, in the case of communicating meters, sent to equipment external to the meter, and, for example, to the remote information system.

Optionally, on detection of loss of neutral and when the imbalance in the line-to-neutral voltages is considered to be too high and dangerous for the equipment downstream, in the case of meters provided with breakers, the breakers are activated to switch to the open state and thus protect the equipment downstream.

Finally, it is also possible to use the invention proposed here in a different way in order not to detect the loss of a conductor (phase(s) and/or neutral), but rather to automatically detect the wiring used for connection to the network (2 wires, 3 wires, 4 wires, etc.).

Naturally, the invention is not limited to the described embodiments, but covers any variant that falls within the scope of the invention as defined by the claims.

The item of electrical equipment in which the invention is implemented (at least partially) is not necessarily a meter, but may be any type of equipment connected to a network and capable of being provided with voltage sensors (a circuit breaker, for example).

Annexes

Annex 1

An example of a reference table is provided here.

The reference table, which comprises 32 rows and 20 columns, has been split into 4 tables to improve the readability of the table.

Table 1 comprises 32 rows and the 6 left-hand columns of the reference table; table 2 comprises 32 rows and 5 columns situated to the right of the columns of table 1; table 3 comprises 32 rows and 6 columns situated to the right of the columns of table 2; table 4 comprises 32 rows and 3 columns situated to the right of the columns of table 3.

TABLE 1

| Connection configurations | | Presence/Absence of each Line | | | |
|---|---|---|---|---|---|
| | | N | Li | Lj | Lk |
| All Lines Connected (Nominal Conditions) | 3P + N | ON | ON | ON | ON |
| Neutral Disconnected | 3P | OFF | ON | ON | ON |
| Neutral Disconnected | 3P | OFF | ON | ON | ON |
| Neutral Disconnected | 3P | OFF | ON | ON | ON |
| Neutral Disconnected | 3P | OFF | ON | ON | ON |
| Neutral Disconnected | 3P | OFF | ON | ON | ON |
| Line i Disconnected | 2P + N | ON | OFF | ON | ON |
| Line i Disconnected | 2P + N | ON | OFF | ON | ON |
| Line i Disconnected | 2P + N ("false 3P + N") | ON | OFF ("ON") | ON | ON |
| Line i Disconnected | 2P + N ("false 3P + N") | ON | OFF ("ON") | ON | ON |
| Line i & Line j Disconnected | 1P + N | ON | OFF | OFF | ON |
| Line i & Line j Disconnected | 1P + N | ON | OFF | OFF | ON |
| Line i & Line j Disconnected | 1P + N | ON | OFF | OFF | ON |
| Line i & Line j Disconnected | 1P + N | ON | OFF | OFF | ON |
| Line i & Line j Disconnected | 1P + N | ON | OFF | OFF | ON |
| Line i & Line j Disconnected | 1P + N ("false 2P + N") | ON | OFF ("ON") | OFF | ON |
| Line i & Line j Disconnected | 1P + N ("false 2P + N") | ON | OFF ("ON") | OFF | ON |
| Line i & Line j Disconnected | 1P + N ("false 2P + N") | ON | OFF | OFF ("ON") | ON |
| Line i & Line j Disconnected | 1P + N ("false 2P + N") | ON | OFF | OFF ("ON") | ON |
| Line i & Line j Disconnected | 1P + N ("false 3P + N") | ON | OFF ("ON") | OFF ("ON") | ON |
| Neutral & Line i Disconnected | 2P | OFF | OFF | ON | ON |
| Neutral & Line i Disconnected | 2P | OFF | OFF | ON | ON |
| Neutral & Line i Disconnected | 2P | OFF | OFF | ON | ON |
| Neutral & Line i Disconnected | 2P | OFF | OFF | ON | ON |
| Neutral & Line i Disconnected | 2P | OFF | OFF | ON | ON |
| Neutral & Line i Disconnected | 2P | OFF | OFF ("ON") | ON | ON |
| Neutral & Line i Disconnected | 2P | OFF | OFF ("ON") | ON | ON |
| Neutral & Line i Disconnected | 2P | OFF | OFF ("ON") | ON | ON |
| Neutral & Line i Disconnected | 2P | OFF | OFF ("ON") | ON | ON |
| Neutral & Line i Inverted | 3P + N  N − P invert | ON invert | ON invert | ON | ON |

TABLE 2

| Impedance Conditions between each Line (on downstream side in regard to the disconnection point(s)) | Position of each Line on the Fresnel diagram with respect to the ABCD Fresnel reference Points (for i = 1; j = 2; k = 3) | | | |
|---|---|---|---|---|
| | N | P1 | P2 | P3 |
| Any Balanced Zi = Zj = Zk | A | B | C | D |
| Any Unbalanced Zi Zj Zk | within BCD (except A) | B | C | D |
| Zi << (Zj & Zk) (e.g. terminal N shunt to terminal i) | B | B | C | D |
| Zj << (Zi & Zk) (e.g. terminal N shunt to terminal j) | C | B | C | D |
| Zk << (Zi & Zj) (e.g. terminal N shunt to terminal k) | D | B | C | D |
| Any | A | ACD | C | D |
| Zi << (Zij & Zik) | A | A | C | D |
| Zij << (Zi & Zik) (e.g. terminal i shunt to terminal j) | A | C | C | D |
| Zik << (Zi & Zij) (e.g. terminal i shunt to terminal k) | A | D | C | D |
| Any | A | [AD] | [AD] | D |
| Zij << (Zi & Zik) or Zij << (Zj & Zjk) | A | [AD] | [AD] | D |
| Zi << Zik | A | A | [AD] | D |
| Zj << Zjk | A | [AD] | A | D |

TABLE 2-continued

| Impedance Conditions between each Line (on downstream side in regard to the disconnection point(s)) | Position of each Line on the Fresnel diagram with respect to the ABCD Fresnel reference Points (for i = 1; j = 2; k = 3) | | | |
|---|---|---|---|---|
| | N | P1 | P2 | P3 |
| Zi << Zik and Zj << Zjk | A | A | A | D |
| Zik << Zi (e.g. terminal i shunt to terminal k) | A | D | [AD] | D |
| Zik << Zi and Zj << Zjk | A | D | A | D |
| Zjk << Zj (e.g. terminal j shunt to terminal k) | A | [AD] | D | D |
| Zi << Zik and Zjk << Zj | A | A | D | D |
| Zik << Zi and Zjk << Zj | A | D | D | D |
| Any | [CD] | [CD] | C | D |
| Zi << (Zij & Zik) or Zi << (Zj & Zk) | [CD] | [CD] | C | D |
| Zj << Zk (e.g. terminal N shunt to terminal j) | C | [CD] | C | D |
| Zj << Zk and Zij << (Zi & Zik) (e.g. terminal N & i shunt to terminal j) | C | C | C | D |
| Zk << Zj (e.g. terminal N shunt to terminal k) | D | [CD] | C | D |
| Zk << Zj and Zik << (Zi & Zij) (e.g. terminal N & i shunt to terminal k) | D | D | C | D |
| Zij << (Zi & Zik) (e.g. terminal i shunt to terminal j) | [CD] | C | C | D |
| Zik << (Zi & Zij) (e.g. terminal i shunt to terminal k) | [CD] | D | C | D |
| Zj << Zk and Zik << (Zi & Zij) (e.g. terminal N shunt to terminal j & terminal i shunt to terminal k) | C | D | C | D |
| Zk << Zj and Zij << (Zi & Zik) (e.g. terminal N shunt to terminal k & terminal i shunt to terminal j) | D | C | C | D |
| Any | B | A | C | D |

TABLE 3

| Measured Angles between phases | | | Measured Line-to-Neutral Voltages | | |
|---|---|---|---|---|---|
| α(i, j) | α(j, k) | α(k, i) | V'i | V'j | V'k |
| 120° [60°; 120°] [120°; 180°] | 120° [60°; 120°] [120°; 180°] | 120° [60°; 120°] [120°; 180°] | Vn [0; SQRT(3).Vn] | Vn [0; SQRT(3).Vn] | Vn [0; SQRT(3).Vn] |
| X | 60° | X | 0 | SQRT(3).Vn | SQRT(3).Vn |
| X | X | 60° | SQRT(3).Vn | 0 | SQRT(3).Vn |
| 60° | X | X | SQRT(3).Vn | SQRT(3).Vn | 0 |
| [−120°; 0°] | 120° | [−120°; 0°] | [0; Vn] | Vn | Vn |
| X | 120° | X | 0 | Vn | Vn |
| 0° | 120° | −120° | Vn | Vn | Vn |
| −120° | 120° | 0° | Vn | Vn | Vn |
| 0° | 0° | 0° | [0; Vn] | [0; Vn] | Vn |
| X | 0° | X | [0; Vn] | [0; Vn] | Vn |
| X | 0° | X | 0 | [0; Vn] | Vn |
| X | X | 0° | [0; Vn] | 0 | Vn |
| X | X | X | 0 | 0 | Vn |
| 0° | 0° | 0° | Vn | [0; Vn] | Vn |
| X | X | 0° | Vn | 0 | Vn |
| 0° | 0° | 0° | [0; Vn] | Vn | Vn |
| X | 0° | X | 0 | Vn | Vn |
| 0° | 0° | 0° | Vn | Vn | Vn |
| 0° or 180° | 180° | 0° or 180° | [0; SQRT(3).Vn] | [0; SQRT(3).Vn] | [0; SQRT(3).Vn] |
| X | 180° | X | 0 | [0; SQRT(3).Vn] | [0; SQRT(3).Vn] |
| X | X | 0° | [0; SQRT(3).Vn] | 0 | SQRT(3).Vn |
| X | X | X | 0 | 0 | SQRT(3).Vn |
| 0° | X | X | [0; SQRT(3).Vn] | SQRT(3).Vn | 0 |
| X | X | X | 0 | SQRT(3).Vn | 0 |
| 0° | 180° | 180° | [0; SQRT(3).Vn] | [0; SQRT(3).Vn] | [0; SQRT(3).Vn] |
| 180° | 180° | 0° | [0; SQRT(3).Vn] | [0; SQRT(3).Vn] | [0; SQRT(3).Vn] |
| X | X | 0° | SQRT(3).Vn | 0 | SQRT(3).Vn |
| 0° | X | X | SQRT(3).Vn | SQRT(3).Vn | 0 |
| −30° | 60° | −30° | Vn | SQRT(3).Vn | SQRT(3).Vn |

(X: not measurable, due to low voltage condition on associated Line(s))

TABLE 4

| Measured Line-to-line voltages | | |
| --- | --- | --- |
| U'i | U'j | U'k |
| SQRT(3).Vn | SQRT(3).Vn | SQRT(3).Vn |
| SQRT(3).Vn | SQRT(3).Vn | SQRT(3).Vn |
| SQRT(3).Vn | SQRT(3).Vn | SQRT(3).Vn |
| SQRT(3).Vn | SQRT(3).Vn | SQRT(3).Vn |
| SQRT(3).Vn | SQRT(3).Vn | SQRT(3).Vn |
| [0; SQRT(3).Vn] | SQRT(3).Vn | [0; SQRT(3).Vn] |
| Vn | SQRT(3).Vn | Vn |
| 0 | SQRT(3).Vn | SQRT(3).Vn |
| SQRT(3).Vn | SQRT(3).Vn | 0 |
| [0; Vn] | [0; Vn] | [0; Vn] |
| 0 | [0; Vn] | [0; Vn] |
| [0; Vn] | [0; Vn] | Vn |
| [0; Vn] | Vn | [0; Vn] |
| 0 | Vn | Vn |
| [0; Vn] | [0; Vn] | 0 |
| Vn | Vn | 0 |
| [0; Vn] | 0 | [0; Vn] |
| Vn | 0 | Vn |
| 0 | 0 | 0 |
| [0; SQRT(3).Vn] | SQRT(3).Vn | [0; SQRT(3).Vn] |
| [0; SQRT(3).Vn] | SQRT(3).Vn | [0; SQRT(3).Vn] |
| [0; SQRT(3).Vn] | SQRT(3).Vn | [0; SQRT(3).Vn] |
| 0 | SQRT(3).Vn | SQRT(3).Vn |
| [0; SQRT(3).Vn] | SQRT(3).Vn | [0; SQRT(3).Vn] |
| SQRT(3).Vn | SQRT(3).Vn | 0 |
| 0 | SQRT(3).Vn | SQRT(3).Vn |
| SQRT(3).Vn | SQRT(3).Vn | 0 |
| SQRT(3).Vn | SQRT(3).Vn | 0 |
| 0 | SQRT(3).Vn | SQRT(3).Vn |
| Vn | SQRT(3).Vn | Vn |

Annex 2

The first exploratory algorithm is as follows:

```
// Parameters
Vn = 230           //Vrms; nominal voltage
Tol_high = 10%     // initial tolerance for the input voltage: Vn + Tol_high
Tol_low = 10%      // initial tolerance for the input voltage: Vn - Tol_low
Vdanger = 276      // Vrms; voltage threshold considered dangerous for the downstream equipment
Vlow = 184         //Vrms; voltage considered abnormally low
Voff = 30          //Vrms; voltage so low that it is considered to be an absence of phase
X = 1%             // to take into account, in particular, the 120° inter-phase uncertainty
Y = 1              //V; to take into account, in particular, the uncertainty in the voltage measurement
// Hypothesis: three-phase, four-wire network (3P+N) with fixed and constant phase shift
of 120° between phases (+/-(X/2)%)
// V[i] = root mean square voltage measured between the phase_i & the neutral over the
last second
// U[i] = root mean square voltage measured between the phase_i & the phase_j over the
last second
// In principle, take the fundamental root mean square voltage measurement (50Hz)
loop every second
   NeutralConnectStatus = UNKNOWN
   PhaseConnectStatus[ ] = [UNKNOWN;UNKNOWN;UNKNOWN]
   Phase VoltageStatus[ ] = [UNKNOWN;UNKNOWN;UNKNOWN]
   for i = 1 to 3
      a[i] = V[i]/Vref
   end for
   for i = 1 to 3
      j = i+1 %3
      // Calculation of the expected line-to-line voltages, knowing the line-to-
neutral voltages, if all the lines are present (3P+N)
      Uprev[i] = Vref.SQRT(a[i]²+a[j]²+a[i].a[j])
      // Counting of the measured line-to-line voltages with an abnormal value
      if ((U[i]<(Uprev[i]) or (U[i]>(Uprev[i])))  // if ((U[i]<(Uprev[i]-(2.Y))) or
(U[i]>(Uprev[i]+(2.Y))))
         abnormal[i] = 1
      else
         abnormal[i] = 0
      end if
   end for
   if (sum(abnormal[ ])=0)
      // default case: all the lines are present
      NeutralConnectStatus = CONNECTED
      PhaseConnectStatus[ ] = [CONNECTED;CONNECTED;CONNECTED]
      // specific case: one phase has an extremely low voltage, which is
considered to an absence of phase
      for i = 1 to 3
         if (V[i]<Voff)
            PhaseConnectStatus[i] = DISCONNECTED
         end if
      end for
   end if
   if (sum(abnormal[ ])=1)
      // default case: loss of the neutral only (and obviously low imbalance of
the downstream loads)
```

```
        // NeutralConnectStatus = DISCONNECTED
        // default case (alternative): not yet significant enough to declare a loss of
neutral, it is still considered potentially present
        NeutralConnectStatus = CONNECTED
        PhaseConnectStatus[ ] = [CONNECTED;CONNECTED;CONNECTED]
     v// counter-proposal: loss of one phase only (brought back between one of
the remaining phases and the neutral)
        for i = 1 to 3
           j = i+1 %3
           k = i+2 %3
           if ((V[i]+U[i]=V[j]) or (V[i]+U[k]=V[k])) // if ((V[i]+U[i]=V[j]+/−
(2.Y)) or (V[i]+U[k]=V[k]+/−(2.Y)))
              NeutralConnectStatus = CONNECTED
              PhaseConnectStatus[i] = DISCONNECTED
              // processing of the specific case of the counter-proposal
(obtained if 1 phase is connected to another phase)
              if ((V[i]=V[j]) or (V[i]=V[k])) // if ((V[i]=V[j]+/−Y) or
(V[i]=V[k]+/−Y))
                 PhaseConnectStatus[i] = CONNECTED
              end if
           end if
        end for
   end if
   if (sum(abnormal[ ])=2)
     // default case: loss of the neutral only (and obviously low imbalance of
the downstream loads)
     // NeutralConnectStatus = DISCONNECTED
     // default case (alternative): not yet significant enough to declare a loss of
neutral, it is still considered potentially present
        NeutralConnectStatus = CONNECTED
        PhaseConnectStatus[ ] = [CONNECTED;CONNECTED;CONNECTED]
     // counter-proposal: loss of one phase only (brought back between the 2
other phases and the neutral)
        for i = 1 to 3
           j = i+1 %3
           k = i+2 %3
           if (((V[i]<V[j]) and (U[i]<V[j])) or ((V[i]<V[k]) and (U[k]<V[k])))
// if (((V[i]<V[j]+Y) and (U[i]<V[j]+Y)) or ((V[i]<V[k]+Y) and (U[k]<V[k]+Y)))
              NeutralConnectStatus = CONNECTED
              PhaseConnectStatus[i] = DISCONNECTED
           end if
        end for
   end if
   if (sum(abnormal[ ])=3)
     // default case: loss of the neutral only (and clearly significant imbalance
of the downstream loads)
        NeutralConnectStatus = DISCONNECTED
        PhaseConnectStatus[ ] = [CONNECTED;CONNECTED;CONNECTED]
     // counter-proposal 1: loss of the neutral and also of one phase (brought
back between the 2 other phases)
        for i = 1 to 3
           j = i+1 %3
           k = i+2 %3
           if    ((V[j]+V[k]=U[j]) and (U[i]+U[k]=U[j])) // if
((V[j]+V[k]=U[j]+/−(2.Y)) and (U[i]+U[k]=U[j]+/−(2.Y)))
              PhaseConnectStatus[i] = DISCONNECTED
              // processing of the specific case of the counter-proposal 1
(obtained if 1 phase is connected to another phase)
              if ((U[i]=U[j]) or (U[k]=U[j])) // if ((U[i]=U[j]+/−(2.Y)) or
(U[k]=U[j]+/−(2.Y)))
                 PhaseConnectStatus[i] = CONNECTED
              end if
           end if
        end for
     // counter-proposal 2: loss of 2 phases only (brought back between the
neutral and the remaining phase)
        for i = 1 to 3
           j = i+1 %3
           k = i+2 %3
           if     ((V[i]+U[k]=V[k]) and (V[j]+U[j]=V[k])) // if
((V[i]+U[k]=V[k]+/−(2.Y)) and (V[j]+U[j]=V[k]+/−(2.Y)))
              NeutralConnectStatus = CONNECTED
              PhaseConnectStatus[i] = DISCONNECTED
              PhaseConnectStatus[j] = DISCONNECTED
              // processing of the specific case of the counter-proposal 2
(obtained if the 3 phases are connected together)
              if ((V[i]=V[j]) and (V[i]=V[k])) // if ((V[i]=V[j]+/−Y) and
(V[i]=V[k]+/−Y))
   PhaseConnectStatus[ ]=[CONNECTED;CONNECTED;CONNECTED]
```

-continued

```
                end if
            end if
        end for
        // counter-proposal 3: inversion of the neutral and one phase in the wiring
of the meter
        for i = 1 to 3
            j = i+1 %3
            k = i+2 %3
            // Calculation of the expected line-to-line voltages, knowing the
line-to-neutral voltages, if all the lines are present (3P+N) and assuming an inversion of
the neutral and the phase i
            a[i] = V[i]/Vref
            a[j] = U[i]/Vref
            a[k]= U[k]/Vref
            Uprev_inv[i] = Vref.SQRT(a[i]²+a[j]²+a[i].a[j])
            Uprev_inv[j] = Vref.SQRT(a[j]²+a[k]²+a[j].a[k])
            Uprev_inv[k] = Vref.SQRT(a[k]²+a[i]²+a[k].a[i])
            if (Uprev_inv[ ]=[V[j];U[j];V[k]) // if (Uprev_inv[ ]=[V[j]+/-
(2.Y);U[j]+/-(2.Y); V[k]+/-(2.Y))
                NeutralConnectStatus = INVERTED_WITH_PHASE
                PhaseConnectStatus[i] = INVERTED_WITH_NEUTRAL
                PhaseConnectStatus[j] = CONNECTED
                PhaseConnectStatus[k] = CONNECTED
            end if
        end for
    end if
    for i = 1 to 3
    // A status is given for the voltage levels from the network
    if (NeutralConnectStatus = DISCONNECTED)
        Phase VoltageStatus[i] = UNKNOWN
    elseif (PhaseConnectStatus[i] = DISCONNECTED)
        Phase VoltageStatus[i] = UNKNOWN
    elseif (V[i]>Vdanger)
        Phase VoltageStatus[i] = DANGEROUS_OVERVOLTAGE
    elseif (V[i]>(1+Tol_high).Vn)
        Phase VoltageStatus[i] = OVERVOLTAGE
    elseif (V[i]<(1-Tol_low). Vn)
        Phase VoltageStatus[i] = UNDERVOLTAGE
    elseif (V[i]<Vlow)
        Phase VoltageStatus[i] = DEEP_UNDERVOLTAGE
    else
        Phase VoltageStatus[i] = NORMAL
    end if
    // A status is given for the dangerousness of the voltage level on the
downstream side
    end for
    if (max(V[ ])>Vdanger)
        DownStream VoltageDanger = TRUE
        // possibly open the breakers in order to protect the equipment connected
downstream
    else
        DownStream VoltageDanger = FALSE
    end if
end loop
```

Annex 3

The second exploratory algorithm is as follows:

```
// Parameters
Vn =230           //in Vrms; nominal voltage
Tol_high =10%     // initial tolerance for the input voltage: Vn + Tol_high
Tol_low = 10%     // initial tolerance for the input voltage: Vn – Tol_low
Vdanger = 276     //in Vrms; voltage threshold considered dangerous for the
downstream equipment
Vlow = 184        //in Vrms; voltage considered abnormally low
Voff = 30         //in Vrms; voltage so low that it is considered to be an absence of
phase
Vmargin = 1       //in V; in order to take into account the measurement uncertainty
Aref = 120        //in °; nominal phase shift angle between phases
Atolgrd = 1       //in °; in order to take into account the initial tolerance from the
power grid
Atolmeas = 3 //in °; in order to take into account the measurement uncertainty
Amargin = Atolgrd + Atolmeas
Alow        =        2.acos((((1+Tol_high).Vn)²-((1-
Tol_low).Vn).((1+Tol_high).Vn).cos(Aref)/(((1+Tol_high).Vn).SQRT(((1-
Tol_low).Vn)²+((1+Tol_high).Vn)²-2.((1-Tol_low).Vn).((1+Tol_high).Vn).cos(Aref))))
```

```
                        // the angle between phase-to-phase to phase-to-phase
vectors (e.g. U12 to U13) is nominally 60° ((180°−Aref)/2) if considering perfectly
balanced voltage levels
                        //Alow is the lowest angle between phase-to-phase to
phase-to-phase vectors, considering initial tolerances on line-to-neutral voltages
                        //Alow is the lowest forecasted measurable angle in case of
a neutral loss (phases remaining all connected)
Ahigh            =                    2.acos((((1−Tol_low).Vn)2−((1+Tol_high).Vn).
((1−Tol_low).Vn).cos(Aref))/(((1−Tol_low).Vn).SQRT(((1+Tol_high).Vn)2+((1−
Tol_low).Vn)²−2.((1+Tol_high).Vn).((1−Tol_low).Vn).cos(Aref))))
                        // the angle between phase-to-phase to phase-to-phase
vectors (e.g. U12 to U13) is nominally 60° ((180°−Aref)/2) if considering perfectly
balanced voltage levels
                        // Ahigh is the highest angle between phase-to-phase to
phase-to-phase vectors, considering initial tolerances on Line Voltages
// Hypothesis: 4-wire network (3P+N) with fixed and constant angles between the phases
at Aref (120°)
// V[i] = RMS voltage measured between phase_i & neutral during last second
// A[i] = angle measured between phase_i & phase_j during last second, value within the
range ]−180°;180°]
// NB: "if" statements should be implemented with the margins on thresholds (i.e. those
set in comment below)
loop (every_second)
   NeutralConnectStatus = UNKNOWN
   PhaseConnectStatus[ ] = [UNKNOWN;UNKNOWN;UNKNOWN]
   Phase VoltageStatus[ ] = [UNKNOWN;UNKNOWN;UNKNOWN]
   ConnectDirection = UNKNOWN
   // Patch in case there is no AC input voltage (e.g. during network power cut or
micro-cut, meter running on its internal energy reserve, or some R&D lab conditions)
   if ((V[1]<Voff) and (V[2]<Voff) and (V[3]<Voff))
      BREAK // algorithm is inhibited
   end if
   // if Voltage is too low, angle is considered as not reliable to measure and therefore
forced to 0°
   for i = 1 to 3
      j = i+1 %3
      k = i+2 %3
      if (V[i]<Voff)
         A[i] = 0
         A[k] = 0
      end if
   end for
   // Study case: all lines connected
   if (A[ ]=[Aref;Aref;Aref]) // if A[ ]=[Aref+/−Amargin;Aref+/−Amargin;Aref+/−
Amargin]
      NeutralConnectStatus = CONNECTED
      PhaseConnectStatus[ ] = [CONNECTED;CONNECTED;CONNECTED]
      ConnectDirection = DIRECT
   end if
   if   (A[ ]=[−Aref ;−Aref ;−Aref]) // if A[ ]=[−Aref+/−Amargin;
−Aref+/−Amargin;−Aref+/−Amargin]
      NeutralConnectStatus = CONNECTED
      PhaseConnectStatus[ ] = [CONNECTED;CONNECTED;CONNECTED]
      ConnectDirection = INDIRECT
   end if
   // Study case: inversion of neutral line and a phase line on terminal connexions
   if (NeutralConnectStatus = UNKNOWN)
         for i = 1 to 3
            j = i+1 %3
            k = i+2 %3
            if ((Alow/2<=−A[i]<=Ahigh/2) and (Alow<=A[j]<=Ahigh) and
(Alow/2<=−A[k]<=Ahigh/2)) // if (((Alow/2−Amargin)<=−A[i]<=(Ahigh/2+Amargin))
and ((Alow−Amargin)<=A[j]<=(Ahigh+Amargin)) and ((Alow/2−Amargin)<=−A[k]<=
(Ahigh/2+Amargin)))
               NeutralConnectStatus = INVERTED_WITH_PHASE
               PhaseConnectStatus[i] = INVERTED_WITH_NEUTRAL
               PhaseConnectStatus[j] = CONNECTED
               PhaseConnectStatus[k] = CONNECTED
               ConnectDirection = DIRECT
            elseif ((Alow/2<=−A[i]<=Ahigh/2) and (Alow<=−A[j]<=high)
and (Alow/2<=A[k]<=Ahigh/2)) // if (((Alow/2−Amargin)<=−A[i]<=(Ahigh/2+Amargin))
and     ((Alow−Amargin)<=−A[j]<=(Ahigh+Amargin))    and    ((Alow/2−
Amargin)<=A[k]<=(Ahigh/2+Amargin)))
               NeutralConnectStatus = INVERTED_WITH_PHASE
               PhaseConnectStatus[i] = INVERTED_WITH_NEUTRAL
               PhaseConnectStatus[j] = CONNECTED
               PhaseConnectStatus[k] = CONNECTED
               ConnectDirection = INDIRECT
            end for
```

```
      end if
      // Study case: 1 phase disconnected (other 2 phases and neutral still connected)
      if (NeutralConnectStatus = UNKNOWN)
         for i = 1 to 3
            j = i+1 %3
            k = i+2 %3
            if ((A[i]=Aref) and (-Aref <=A[j]<=0) and (-Aref<=A[k]<=0)) // if
((A[i]=Aref+/-Amargin) and (-Aref-Amargin<=A[j]<=0+Amargin) and
(-Aref-Amargin<=A[k]<=0+Amargin))
               NeutralConnectStatus = CONNECTED
               ConnectDirection = DIRECT
            end if
            if ((A[i]=-Aref) and (0<=A[j]<=Aref) and (0<=A[k]<=Aref)) // if
((A[i]=-Aref+/-Amargin)    and    (0-Amargin<=A[j]<=Aref+Amargin)    and
(0-Amargin<=A[k]<=Aref+Amargin))
               NeutralConnectStatus = CONNECTED
               ConnectDirection = INDIRECT
            end if
         end for
         if (NeutralConnectStatus = CONNECTED)
            for i = 1 to 3
               j = i+1 %3
               k = i+2 %3
               if (V[i]<Voff)
                  PhaseConnectStatus[i] = DISCONNECTED
               elseif ((ConnectDirection=DIRECT) and ((A[i]=Aref) or
(A[k]=Aref))) // elseif ((ConnectDirection=DIRECT) and ((A[i]=Aref+/-Amargin) or
(A[k]=Aref+/-Amargin)))
                  PhaseConnectStatus[i] = CONNECTED
               elseif ((ConnectDirection=INDIRECT) and ((A[i]=-Aref)
or (A[k]=-Aref))) // elseif ((ConnectDirection=INDIRECT) and
((A[i]=-Aref+/-Amargin) or (A[k]=-Aref+/-Amargin)))
                  PhaseConnectStatus[i] = CONNECTED
               elseif (A[i]=0) // elseif (A[i]=0+/-Amargin)
                  if (V[i]<V[j]) // if (V[i]<V[j]-Vmargin)
                     PhaseConnectStatus[i] = DISCONNECTED
                  else
                     // phase i considered as connected to phase j
                     PhaseConnectStatus[i] = CONNECTED
                  end if
               elseif (A[k]=0)
                  if (V[i]<V[k]) // if (V[i]<V[k]-Vmargin)
                     PhaseConnectStatus[i] = DISCONNECTED
                  else
                     // phase i considered as connected to phase k
                     PhaseConnectStatus[i] = CONNECTED
                  end if
               else
                  PhaseConnectStatus[i] = DISCONNECTED
               end if
            end for
         end if
      end if
      // Study case: neutral disconnected (3 phases still connected)
      if (NeutralConnectStatus = UNKNOWN)
         for i = 1 to 3
            if (Alow<=A[i]<Aref) // if (Alow-Amargin<=A[i]<Aref-Amargin)
               NeutralConnectStatus = DISCONNECTED
               ConnectDirection = DIRECT
            end if
            if (-Aref<A[i]<=-Alow) // if (-Aref+Amargin<A[i]<=-Alow+Amargin)
               NeutralConnectStatus = DISCONNECTED
               ConnectDirection = INDIRECT
            end if
         end for
         if (NeutralConnectStatus = DISCONNECTED)
            PhaseConnectStatus[ ]                =
[CONNECTED;CONNECTED;CONNECTED]
         end if
      end if
      //    Does not represent forecast practical case; detection criteria stated below
not correct; proper criteria not easy to define; study case consequently abandoned
      //    //Study case (unlikely to happen): neutral and 1 phase "quasi-disconnected"
(impedance lines) (other 2 phases still connected)
      //    if (NeutralConnectStatus = UNKNOWN)
      //       for i = 1 to 3
      //          j = i+1 %3
      //          k = i+2 %3
      //          if ((0<A[i]<Alow) and (A[j]>Aref) and (A[k]>Aref)) // if
```

```
((0+Amargin<A[i]<Alow-Amargin)       and       (A[j]>Aref+Amargin)       and
(A[k]>Aref+Amargin))
//                    NeutralConnectStatus = DISCONNECTED
//                    PhaseConnectStatus[i] = DISCONNECTED
//                    PhaseConnectStatus[j] = CONNECTED
//                    PhaseConnectStatus[k] = CONNECTED
//        end for
//     end if
      // Study case: 2 lines disconnected (other 2 lines still connected)
      if (NeutralConnectStatus = UNKNOWN)
         if (A[ ]=[0;0;0]) // if (A[ ]=[0+/-Amargin;0+/-Amargin;0+/-Amargin])
            // to discriminate either we face a neutral loss or not
            for i = 1 to 3
               if (V[i]>(1+0.3).Vn) // Vn+30% chosen because it is the
"middle" between (Vn+20%) and SQRT(3).(Vn-20%)
                  NeutralConnectStatus = DISCONNECTED
               end if
            end for
            if (NeutralConnectStatus = UNKNOWN)
               NeutralConnectStatus = CONNECTED
            end if
         // Study case: 2 phases disconnected (neutral other remaining phase
still connected)
            if (NeutralConnectStatus = CONNECTED)
               for i = 1 to 3
                  j = i+1 %3
                  k = i+2 %3
                  if ((V[i]<V[j]) and (V[i]<V[k])) // if ((V[i]<V[j]-Vmargin)
and (V[i]<V[k]-Vmargin))
                     PhaseConnectStatus[i] = DISCONNECTED
                  else
                     // phase i is the higher, thus the connected one
                     // eventually several phases can finally be
considered as connected here, which would happen if connected together
                     PhaseConnectStatus[i] = CONNECTED
                  end if
               end for
            end if
            // Study case: neutral and 1 phase disconnected (other 2 phases still
connected) (1)
            if (NeutralConnectStatus = DISCONNECTED)
               for i = 1 to 3
                  j = i+1 %3
                  k = i+2 %3
                  if ((V[i]<V[j]) and (V[i]<V[k])) // if ((V[i]<V[j]-Vmargin)
and (V[i]<V[k]-Vmargin))
                     // phase i is the lower, thus a connected one
                     PhaseConnectStatus[i] = CONNECTED
                  elseif ((V[i]>V[j]) and (V[i]>V[k])) // elseif
((V[i]>V[j]+Vmargin) and (V[i]>V[k]+Vmargin))
                     // phase i is the higher, thus a connected one
                     PhaseConnectStatus[i] = CONNECTED
                  elseif ((V[i]=V[j]) or (V[i]=V[k])) // elseif
((V[i]=V[j]+/-Vmargin) or (V[i]=V[k]+/-Vmargin))
                     // eventually the third phase can finally be
considered as connected, which would happen if phase i is connected to either phase j or k
                     PhaseConnectStatus[i] = CONNECTED
                  else
                     PhaseConnectStatus[i] = DISCONNECTED
                  end if
               end for
            end if
         end if
         // Study case: neutral and 1 phase disconnected (other 2 phases still
connected) (2)
         if (NeutralConnectStatus = UNKNOWN)
            for i = 1 to 3
               j = i+1 %3
               k = i+2 %3
               if (A[i]=0) // if (A[i]=0+/-Amargin)
                  NeutralConnectStatus = DISCONNECTED
                  if (A[k]=0) // if (A[k]=0+/-Amargin)
                     PhaseConnectStatus[i] = DISCONNECTED
                     PhaseConnectStatus[j] = CONNECTED
                     PhaseConnectStatus[k] = CONNECTED
                  elseif (V[i]<V[j]) // elseif (V[i]<V[j]-Vmargin)
                     PhaseConnectStatus[i] = DISCONNECTED
                     PhaseConnectStatus[j] = CONNECTED
                     PhaseConnectStatus[k] = CONNECTED
```

```
            elseif (V[j]<V[i]) // elseif (V[j]<V[i]-Vmargin)
                PhaseConnectStatus[i] = CONNECTED
                PhaseConnectStatus[j] = DISCONNECTED
                PhaseConnectStatus[k] = CONNECTED
            else // V[i]=V[j]+/-Vmargin
                PhaseConnectStatus[i] = CONNECTED
                PhaseConnectStatus[j] = CONNECTED
                PhaseConnectStatus[k] = CONNECTED
            end if
          end if
        end for
      end if
    end if
    // All practical study cases should have been covered at that point
    // In case of unexpected practical study case:
    if (NeutralConnectStatus = UNKNOWN)
        NeutralConnectStatus = CONNECTED // or UNKNOWN, as preferred
        PhaseConnectStatus[ ] = [CONNECTED;CONNECTED;CONNECTED]
// or [UNKNOWN;UNKNOWN;UNKNOWN], as preferred
        ConnectDirection = DIRECT // or UNKNOWN, as preferred
        UnexpectedSituation = TRUE
    else
        UnexpectedSituation = FALSE
    end if
    // Let's provide a status here regarding the voltage levels coming from the grid
    for i = 1 to 3
        if (NeutralConnectStatus = DISCONNECTED)
            Phase VoltageStatus[i] = UNKNOWN
        elseif (PhaseConnectStatus[i] = DISCONNECTED)
            Phase VoltageStatus[i] = UNKNOWN
        elseif (V[i]>Vdanger)
            Phase VoltageStatus[i] = DANGEROUS_OVERVOLTAGE
  elseif (V[i]>(1+Tol_high).Vn)
      Phase VoltageStatus[i] = OVERVOLTAGE
  elseif (V[i]<(1-Tol_low).Vn)
      Phase VoltageStatus[i] = UNDERVOLTAGE
  elseif (V[i]<Vlow)
      Phase VoltageStatus[i] = DEEP_UNDERVOLTAGE
  else
      Phase VoltageStatus[i] = NORMAL
  end if
    end for
    // Let's provide a status here regarding the dangerousness of the voltage level on
the downstream side
    if (max(V[ ])>Vdanger)
        DownStream VoltageDanger = TRUE
        // possibly open the breakers here to protect the equipment connected
downstream
    else
        DownStream VoltageDanger = FALSE
    end if
end loop
```

The invention claimed is:

1. A method for monitoring a polyphase electricity network, implemented at least partially in a processing unit of an item of electrical equipment connected to the polyphase electricity network, and comprising the steps, repeated regularly, of:

acquiring voltage measurements taken by voltage sensors ($R_{1A}$, $R_{1B}$, $R_{2A}$, $R_{2B}$, $R_{3A}$, $R_{3B}$) of the item of electrical equipment that are connected to the polyphase electricity network;

producing current values of electrical parameters from the voltage measurements;

accessing a reference table that comprises a list of connection configurations each associated with a distinct combination of reference values of said electrical parameters, the list of connection configurations comprising first connection configurations each corresponding to a distinct combination of connection or disconnection states for each phase (P1, P2, P3) and for the neutral (N);

implementing an exploratory algorithm intended to explore the reference table to identify the connection configuration associated with the current values of the electrical parameters.

2. The monitoring method according to claim 1, wherein the list of connection configurations comprises second connection configurations each corresponding, for one of the phases (P1, P2, P3), to an inversion of the neutral (N) and said phase (P1, P2, P3).

3. The monitoring method according to claim 2, wherein the implementation of the exploratory algorithm comprises the steps of:

testing a connection configuration, by checking whether predetermined criteria associated with said connection configuration are fulfilled, the predetermined criteria being defined based on the electrical parameters;

if the predetermined criteria are fulfilled, deducing therefrom that said connection configuration is that which corresponds to the current values of the electrical parameters, if not, repeating the testing step with another connection configuration, wherein the electrical parameters comprise:
measured line-to-neutral voltages, each measured line-to-neutral voltage being representative of an amplitude of a line-to-neutral voltage ($\vec{V'}_1$, $\vec{V'}_2$, $\vec{V'}_3$) between one of the phases and the neutral; and/or
measured line-to-line voltages, each measured line-to-line voltage being representative of an amplitude of a line-to-line voltage ($\vec{U'}_1$, $\vec{U'}_2$, $\vec{U'}_3$)) between two distinct phases; and/or
measured angles ($Phi_1$, $Phi_2$, $Phi_3$), each measured angle being equal to an angle between a vector representation of a line-to-neutral voltage between one phase and the neutral, and a vector representation of a line-to-neutral voltage between another phase and the neutral,
wherein the exploratory algorithm implemented is a second exploratory algorithm that only uses the measured line-to-neutral voltages and the measured angles as electrical parameters,
wherein the predetermined criteria, associated with the following connection configurations, only comprise comparisons between the measured angles and angular thresholds:
the neutral and all the phases are normally connected;
the neutral is inverted with one of the phases;
the neutral is disconnected and all the phases are connected.

4. The monitoring method according to claim 1, wherein the list of connection configurations comprises third connection configurations each corresponding to one of the phases that is disconnected and that is at the potential of another phase.

5. The monitoring method according to claim 1, wherein the implementation of the exploratory algorithm comprises the steps of:
testing a connection configuration, by checking whether predetermined criteria associated with said connection configuration are fulfilled, the predetermined criteria being defined based on the electrical parameters;
if the predetermined criteria are fulfilled, deducing therefrom that said connection configuration is that which corresponds to the current values of the electrical parameters,
if not, repeating the testing step with another connection configuration.

6. The monitoring method according to claim 5, wherein the electrical parameters comprise:
measured line-to-neutral voltages, each measured line-to-neutral voltage being representative of an amplitude of a line-to-neutral voltage ($\vec{V'}_1$, $\vec{V'}_2$, $\vec{V'}_3$) between one of the phases and the neutral; and/or
measured line-to-line voltages, each measured line-to-line voltage being representative of an amplitude of a line-to-line voltage ($\vec{U'}_1$, $\vec{U'}_2$, $\vec{U'}_3$)) between two distinct phases; and/or measured angles ($Phi_1$, $Phi_2$, $Phi_3$), each measured angle being equal to an angle between a vector representation of a line-to-neutral voltage between one phase and the neutral, and a vector representation of a line-to-neutral voltage between another phase and the neutral, wherein the exploratory algorithm implemented is a first exploratory algorithm that only uses the measured line-to-neutral voltages and the measured line-to-line voltages as electrical parameters, wherein the first exploratory algorithm comprises the step of attempting to detect one or more measured line-to-line voltages that are abnormal, the first exploratory algorithm then consisting in testing sets of connection configurations, which are defined as a function of the number of abnormal measured line-to-line voltages.

7. The monitoring method according to claim 6, wherein the measured line-to-line voltage $U'_i$ is considered to be abnormal if:

$$U'_i < U\text{prev}_i - \alpha \text{ or if } U'_i > U\text{prev}_i + \alpha,$$

where:
$\alpha$ is a margin of uncertainty,
and where:

$$U\text{prev}_i = V_n \cdot \text{SQRT}(ai^2 + aj^2 + ai \cdot aj),$$

where $ai = V_i/V_n$, $aj = V_j/V_n$, $V_i$ is the measured line-to-neutral voltage for the phase Pi, $V_j$ is the measured line-to-neutral voltage for the phase Pj, and $V_n$ is a nominal line-to-neutral voltage.

8. The monitoring method according to claim 5, wherein the electrical parameters comprise:
measured line-to-neutral voltages, each measured line-to-neutral voltage being representative of an amplitude of a line-to-neutral voltage ($\vec{V'}_1$, $\vec{V'}_2$, $\vec{V'}_3$) between one of the phases and the neutral; and/or
measured line-to-line voltages, each measured line-to-line voltage being representative of an amplitude of a line-to-line voltage ($\vec{U'}_1$, $\vec{U'}_2$, $\vec{U'}_3$)) between two distinct phases; and/or
measured angles ($Phi_1$, $Phi_2$, $Phi_3$), each measured angle being equal to an angle between a vector representation of a line-to-neutral voltage between one phase and the neutral, and a vector representation of a line-to-neutral voltage between another phase and the neutral, wherein the exploratory algorithm implemented is a first exploratory algorithm that only uses the measured line-to-neutral voltages and the measured line-to-line voltages as electrical parameters, wherein the predetermined criteria comprise comparisons each made between:
a resulting voltage obtained by adding:
two different measured line-to-neutral voltages; or
a measured line-to-neutral voltage and a measured line-to-line voltage;
and a measured line-to-neutral voltage or a measured line-to-line voltage.

9. The monitoring method according to claim 1, wherein the electrical parameters comprise:
measured line-to-neutral voltages, each measured line-to-neutral voltage being representative of an amplitude of a line-to-neutral voltage ($\vec{V'}_1$, $\vec{V'}_2$, $\vec{V'}_3$) between one of the phases and the neutral; and/or
measured line-to-line voltages, each measured line-to-line voltage being representative of an amplitude of a line-to-line voltage ($\vec{U'}_1$, $\vec{U'}_2$, $\vec{U'}_3$)) between two distinct phases; and/or
measured angles ($Phi_1$, $Phi_2$, $Phi_3$), each measured angle being equal to an angle between a vector representation of a line-to-neutral voltage between one phase and the neutral, and a vector representation of a line-to-neutral voltage between another phase and the neutral.

10. The monitoring method according to claim 9, wherein the measured angles are obtained by implementing a zero-crossing detection method on the voltages measured between the phases and the neutral.

11. The monitoring method according to claim 9, wherein the exploratory algorithm implemented is a first exploratory algorithm that only uses the measured line-to-neutral voltages and the measured line-to-line voltages as electrical parameters.

12. The monitoring method according to claim 9, wherein the exploratory algorithm implemented is a second exploratory algorithm that only uses the measured line-to-neutral voltages and the measured angles as electrical parameters.

13. The monitoring method according to claim 12, wherein the second exploratory algorithm tests whether the phases are wired to the item of electrical equipment in a direct or indirect order.

14. An item of electrical equipment comprising voltage sensors and a processing unit wherein the monitoring method according to claim 1 is implemented.

15. The item of electrical equipment according to claim 14, the item of electrical equipment being a meter.

16. A nontransitory computer-readable storage medium on which a computer program comprising instructions that cause the processing unit of an item of electrical equipment to perform the steps of the monitoring method according to claim 1 is stored, wherein the item of electrical equipment comprising the voltage sensors and the processing unit in which the monitoring method is implemented.

* * * * *